United States Patent
Chin

(10) Patent No.: US 9,233,334 B2
(45) Date of Patent: Jan. 12, 2016

(54) BYPRODUCTS TREATING DEVICE AND A FACILITY FOR MANUFACTURING SEMICONDUCTOR DEVICES HAVING THE BYPRODUCTS TREATING DEVICE

(71) Applicant: Samsung Electronics Co., Ltd., Suwon-Si, Gyeonggi-do (KR)

(72) Inventor: Kyoung-Hwan Chin, Albany, NY (US)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 62 days.

(21) Appl. No.: 14/177,657

(22) Filed: Feb. 11, 2014

(65) Prior Publication Data

US 2014/0238244 A1    Aug. 28, 2014

(30) Foreign Application Priority Data

Feb. 28, 2013   (KR) .................. 10-2013-0021681

(51) Int. Cl.
*H01L 21/67* (2006.01)
*B01D 46/44* (2006.01)
*B01D 46/00* (2006.01)
*C23C 16/44* (2006.01)

(52) U.S. Cl.
CPC .......... *B01D 46/444* (2013.01); *B01D 46/0075* (2013.01); *C23C 16/4412* (2013.01); *H01L 21/67017* (2013.01)

(58) Field of Classification Search
CPC ....... H01L 21/00; H01L 21/67; H01L 21/677; H01L 21/67017; H01L 21/67757; H01L 21/67769; H01L 21/67772; Y01S 414/41; Y01S 414/137; Y01S 414/139

USPC .......... 55/385.2, 472; 454/187; 414/217, 937, 414/939, 940
See application file for complete search history.

(56) References Cited

U.S. PATENT DOCUMENTS

| | | | |
|---|---|---|---|
| 4,851,018 A * | 7/1989 | Lazzari et al. .................. 55/356 |
| 5,181,819 A * | 1/1993 | Sakata et al. .................. 414/217 |
| 6,090,176 A * | 7/2000 | Yoshitake et al. ........... 55/385.4 |
| 2002/0040568 A1* | 4/2002 | Heinemann ..................... 55/282 |
| 2003/0066605 A1 | 4/2003 | Ko et al. |
| 2010/0071548 A1 | 3/2010 | Smith |
| 2011/0082580 A1 | 4/2011 | Philippe et al. |
| 2012/0132619 A1 | 5/2012 | Matsuda et al. |
| 2012/0143390 A1 | 6/2012 | Miwata et al. |

FOREIGN PATENT DOCUMENTS

| | | |
|---|---|---|
| JP | 2009-525861 A | 7/2009 |
| JP | 2010-053723 A | 3/2010 |
| KR | 10-0227852 B1 | 8/1999 |
| KR | 10-0347136 B1 | 7/2002 |
| KR | 10-0432134 B1 | 5/2004 |
| KR | 10-0768887 B1 | 10/2007 |
| KR | 10-0806271 B1 | 2/2008 |

* cited by examiner

*Primary Examiner* — Duane Smith
*Assistant Examiner* — Minh-Chau Pham
(74) *Attorney, Agent, or Firm* — Lee & Morse, P.C.

(57) ABSTRACT

A byproducts treating device includes a transfer unit, a cleaning unit, and a controller. The transfer unit forcibly transfers byproducts from a byproduct source. The cleaning unit is combined with the transfer unit and separates the byproducts into at least one of a power or a byproduct gas. The controller is connected to the cleaning unit and selects at least one selection line for discharging byproduct gas. The byproducts flow from the transfer unit to the cleaning unit without flow lines, and the controller selects the at least one selection line based on a flux of the byproduct gas.

26 Claims, 9 Drawing Sheets

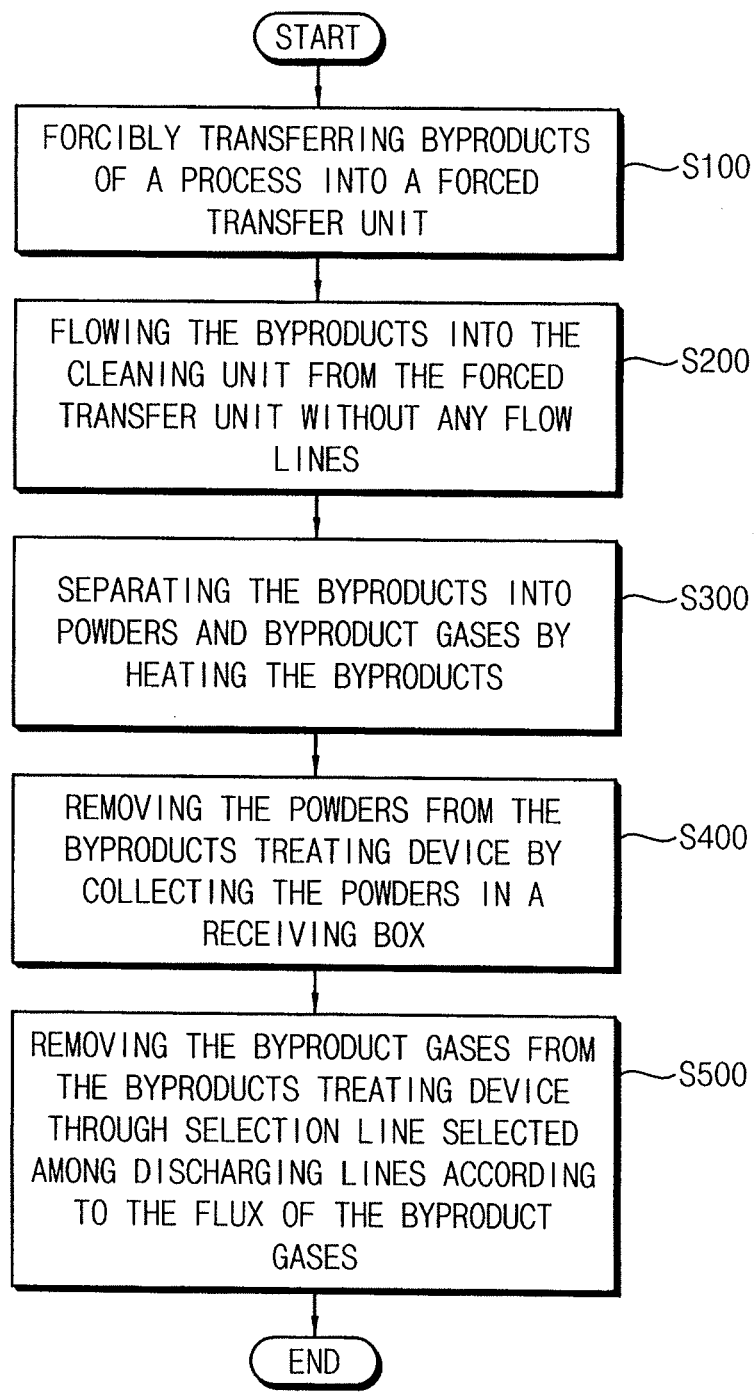

BYPRODUCTS TREATING DEVICE AND A FACILITY FOR MANUFACTURING SEMICONDUCTOR DEVICES HAVING THE BYPRODUCTS TREATING DEVICE

CROSS-REFERENCE TO RELATED APPLICATION

Korean Patent Application No. 10-2013-0021681, filed on Feb. 28, 2013, and entitled "Byproducts Treating Device, Method of Treating Byproducts in a Process and a Facility for Manufacturing Semiconductor Devices Having the Byproducts Treating Device," is incorporated by reference herein in its entirety.

BACKGROUND

1. Field

One or more embodiments described herein relate to treating byproducts.

2. Description of the Related Art

Various processes are used to manufacture semiconductor devices. These processes use different source gases at high temperatures. As a result, various process byproducts are formed. These byproducts include, for example, product materials and unreacted residual source gases.

SUMMARY

In accordance with one embodiment, a byproducts treating device includes a transfer a transfer unit to forcibly transfer byproducts from a byproduct source; a cleaning unit combined with the transfer unit to separate the byproducts into at least one of a power or a byproduct gas; and a controller, connected to the cleaning unit, to select at least one selection line for discharging byproduct gas, wherein the byproducts flow from the transfer unit to the cleaning unit without flow lines and wherein the controller is to select the at least one selection line based on a flux of the byproduct gas.

The transfer unit may be positioned on the cleaning unit; and the byproducts flow from the transfer unit to the cleaning unit in a predetermined direction. The transfer unit may include a pump having an inlet opening and a discharge opening; the cleaning unit is coupled to the pump; the discharge opening of the pump is coupled to the inlet opening; and a boundary portion between the inlet portion and the discharge opening is sealed.

The cleaning unit may include a heater to separate the byproducts into powder and byproduct gas; a coolant to cool the powder and byproduct gas; and a collector to receive and remove the powder from the byproducts treating device.

The controller may include a filter to filter the powder and through which the byproduct gas passes; a vibration generator to apply vibrations to the filter to cause the powder on the filter to be removed; and a receiving vessel to receive the removed powders.

The controller may include a body having a buffer space; a control line through which the byproduct gas flows to the buffer space from the cleaning unit; a plurality of discharge lines having different sizes and through which the byproduct gases are discharged from the buffer space; a plurality of line openers arranged on respective ones of the discharge lines, the plurality of line openers selectively opening respective discharge lines according to a control signal; and a signal generator connected to the line openers and generating the control signal for opening at least one of the discharge lines as the selection line according to a flux of the byproduct gas flowing through the control line.

The line opener may include a stop valve arranged on the discharge line and operated by a control motor. The signal generator includes a detector to detect the flux of the byproduct gas.

The controller may include a fan arranged on an inner surface of the body defining the buffer space, the fan blowing the byproduct gases toward the selection line.

The device may include a discharging accelerator, arranged on the discharge lines, to accelerate discharge of the byproduct gases through the discharge line.

The device may include a trap unit between the transfer unit and the byproduct source, wherein the trap unit removes the powder from the byproducts before the byproducts are transferred to the transfer unit. The trap unit is directly combined with the forced transfer unit, and the byproducts flow to the transfer unit from the trap unit without flow lines.

In accordance with another embodiment, a method of treating byproducts of a process for manufacturing a semiconductor device includes forcibly transferring byproducts into a transfer unit; moving the byproducts into a cleaning unit from the transfer unit without flow lines; separating the byproducts into a powder and a byproduct gas; collecting the powder in a receiving vessel; removing the powder from the receiving vessel; and removing the byproduct gas through at least one selection line selected from a plurality of discharge lines according to flux of the byproduct gas.

Forcibly transferring the byproducts into the transfer unit may be performed by a compressive pump and through at least a transfer line between the byproduct source and the transfer unit, and the transfer line has no bent portions to allow the byproducts to be transferred to the forced transfer unit without change in flow path.

Removing the byproduct gases through at least a selection line may include detecting the flux of the byproduct gases; selecting at least one of the discharge lines as the selection line, the selection line having a size for discharging the detected flux of the byproduct gas; applying a control signal to a line opener corresponding to the selection line; and controlling the line opener to open according to the control signal. The line opener includes a stop valve, and the line opener is controlled to close the discharge lines when the control signal is not applied to the line opener.

In accordance with another embodiment, a facility for manufacturing a semiconductor device includes a process chamber in which a process is performed using source materials and in which byproducts are generated as a result of the process; an emission member to emit the byproducts from the process chamber; and a byproducts treating member to remove toxic materials and pollutants from the byproducts, the byproducts treating member including: a transfer unit to forcibly transfer the emitted byproducts, a cleaning unit directly combined with the transfer unit in such a configuration that the byproducts directly flow from the transfer unit without flow lines, the cleaning unit to separate the byproducts into powder and byproduct gas, and a controller, connected to the cleaning unit, to select a selection line for discharging the byproduct gas according to a flux of the byproduct gas.

The transfer unit may be positioned on the cleaning unit to allow the byproducts to flow from the transfer unit to the cleaning unit in a predetermined direction. The controller may include a body having a buffer space therein, a control line through which the byproduct gas flows to the buffer space from the cleaning unit, a plurality of discharge lines having different sizes and through which the byproduct gas is discharged from the buffer space, a plurality of line openers arranged on respective ones of the discharge lines, the plurality of line openers to selectively opening respective discharge lines according to a control signal, and a signal generator, connected to the line opener, to generate the control signal for opening at least one of the discharge lines as the selection line according to a flux of the byproduct gas flowing through the control line.

The discharge lines may include a first pipe line having a diameter of about 100 mm to about 110 mm, an a second pipe line having a diameter of about 200 mm to about 210 mm. The byproducts treating member may include a trap unit positioned between the transfer unit and the byproduct source, the trap unit to remove the powder from the byproducts before the byproducts are transferred to the transfer unit. The process chamber includes one of an etching process chamber, a deposition process chamber, an ion implantation process chamber, or a cleaning process chamber.

In accordance with another embodiment, a facility for manufacturing a semiconductor device includes a plurality of process chambers in which specific processes are individually performed using respective source materials, wherein respective byproducts are generated as a result of the specific processes; one or more emission members to emit the byproducts from the process chambers; a plurality of byproducts treating members to remove at least one of toxic material or pollutants from respective ones of the byproducts; and a gas container linearly connected to the byproducts treating members without any bent portions, the gas container to receive the byproduct gases from each of byproducts treating members, wherein each of the byproducts treating members includes: a transfer unit to forcibly transfer the emitted byproducts, a cleaning unit directly combined with the transfer unit in such a configuration that the byproducts directly flow from the transfer unit without flow lines, the cleaning unit separating the byproducts into powder and byproduct gas, and a controller, connected to the cleaning unit, to select a selection line for discharging the byproduct gas according to a flux of the byproduct gas.

The controller may include a body having a buffer space, a control line through which the byproduct gas flows to the buffer space from the cleaning unit, a plurality of discharge lines having different size to discharge the byproduct gas from the buffer space, a plurality of line openers arranged on respective ones of the discharge lines, and to selectively open respective discharge lines according to a control signal, and a signal generator, connected to the line opener, to generate the control signal for opening at least one of the discharge lines as the selection line according to a flux of the byproduct gas flowing through the control line, wherein the gas container includes a plurality of input lines connected to the selection lines of the byproducts treating members in such a configuration that the byproduct gas discharged from each of the byproduct treating members are gathered into the gas container through the input lines, respectively.

A flow accelerator may be between the selection line and the input lines, wherein the flow accelerator forcibly supplies the byproduct gas discharged from each byproducts treating member into the gas container through the input lines.

In accordance with another embodiment, a device to treat byproducts includes a transfer unit to transfer byproducts from a byproduct source; and a cleaning unit coupled to the transfer unit to receive the byproducts from the transfer unit through a passage different from a flow line, the cleaning unit to separate the byproducts into at least one of a power or a byproduct gas, wherein the passage extends from an outlet of the transfer unit to an inlet of the cleaning unit and wherein the passage is substantially linear.

The passage may be integrally formed with at least one of the transfer unit or the cleaning unit. The passage is oriented in a vertical direction. The device may also include a controller, connected to the cleaning unit, to select at least one selection line for discharging byproduct gas, wherein the controller is to select the at least one selection line based on a flux of the byproduct gas. The device may also include a trap unit integrally coupled to an inlet of the transfer unit.

BRIEF DESCRIPTION OF THE DRAWINGS

Features will become apparent to those of ordinary skill in the art by describing in detail exemplary embodiments with reference to the attached drawings in which:

FIG. 5 illustrates an embodiment of a method of treating byproducts;

DETAILED DESCRIPTION

Figure 1:
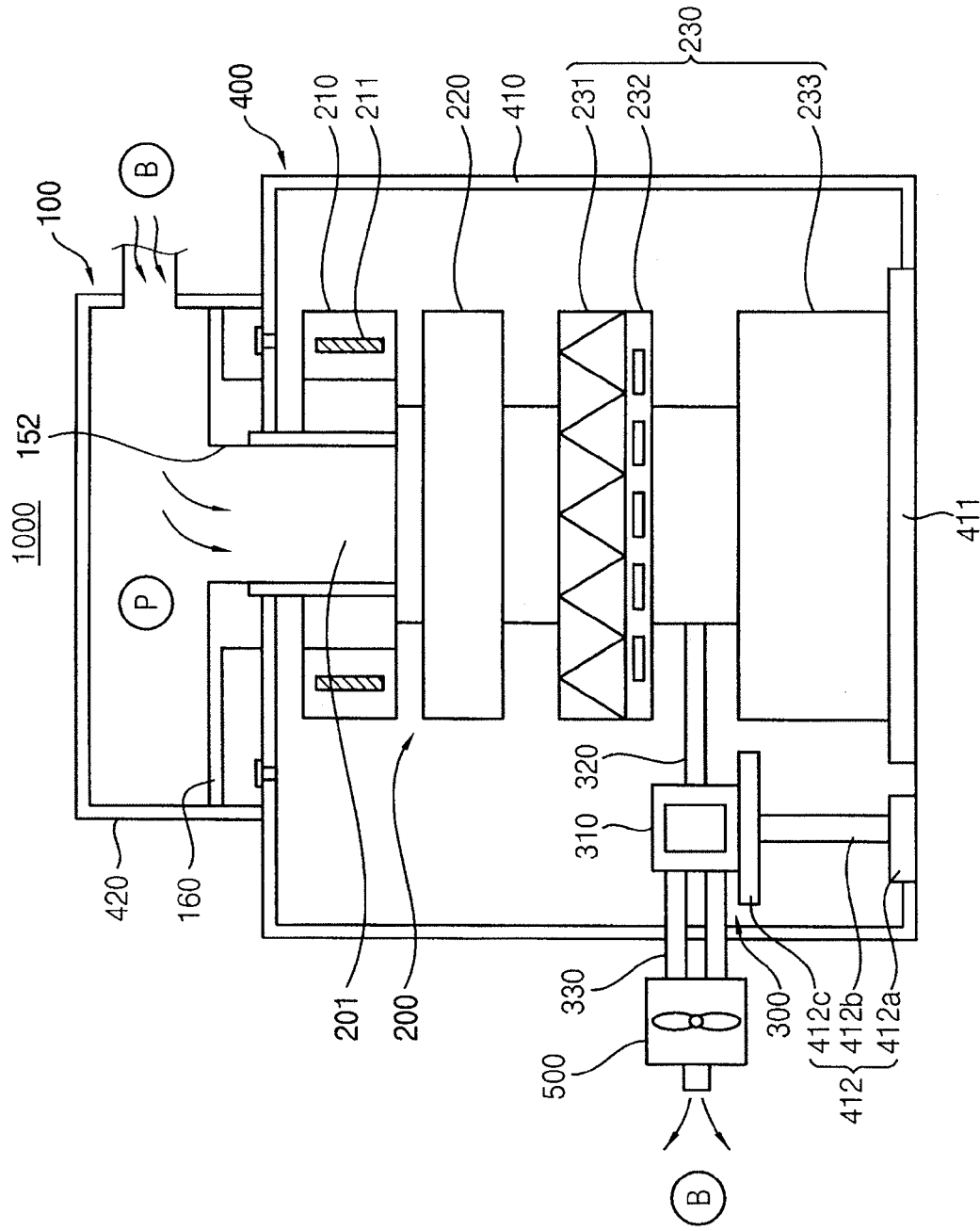
FIG. 1 illustrates an embodiment of a byproducts treating device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a byproducts treating device 1000 which includes a forced transfer unit 100, a cleaning unit 200, a controller 300, and a housing 400. The forced transfer unit 100 forcibly transfers process byproducts from a byproduct source. The cleaning unit 200 is directly combined with the forced transfer unit 100 such that the byproducts may directly flow from the forced transfer unit 100 without flow lines. The cleaning unit 200 also separates the byproducts into powders and byproduct gases.

The controller 300 is connected to the cleaning unit 200 and selects at least one selection line among a plurality of discharge lines for discharging the byproduct gases according to a flux of the byproduct gases. The housing 400 contains the forced transfer unit 100, the cleaning unit 200, and the controller 300, e.g., the forced transfer unit 100, the cleaning unit 200, and the controller 300 may be protected from surroundings by the housing 400.

For example, the forced transfer unit 100 may apply an external force to the byproducts generated based on chemical reactions with the byproduct source. The byproducts may be forced to be transferred from the byproduct source to the cleaning unit 200 by the forced transfer unit 100 at an appropriate or predetermined transfer velocity. In the present example embodiment, the forced transfer unit 100 may include a pump system connected to the byproduct source through one or more pipe lines. Examples of the pump system include a reciprocal pump to rapidly transfer byproducts in the byproduct source to the cleaning system 200 using a reciprocating motion of a piston.

Figure 2:
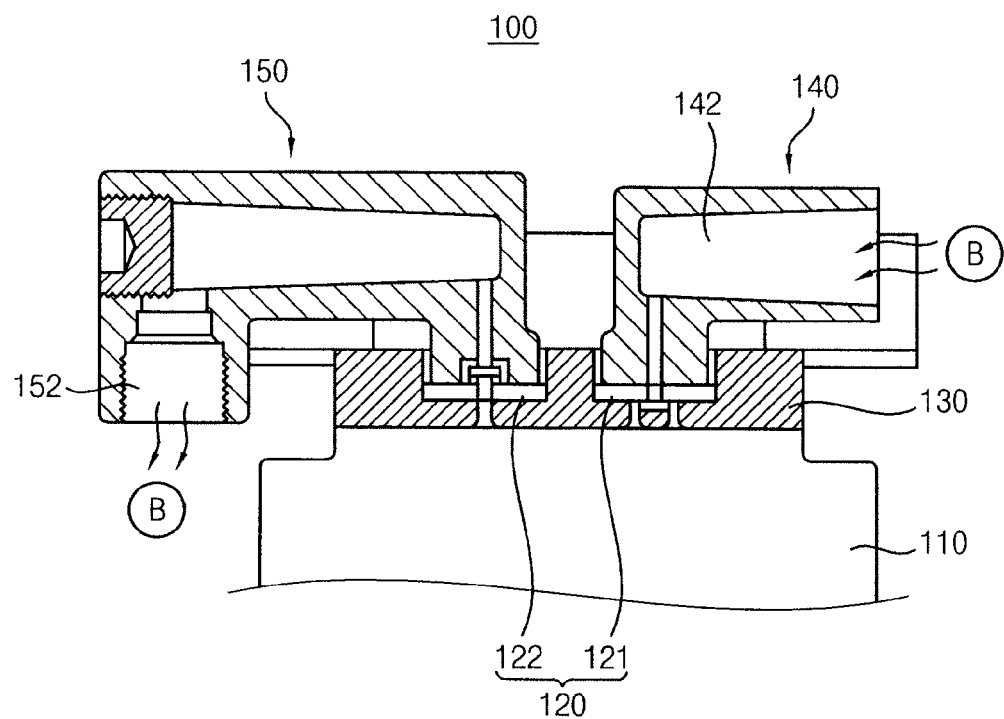
FIG. 2 illustrates an example of a transfer unit of the byproducts treating device.

FIG. 2 is a cross-sectional view illustrating an example of the forced transfer unit 100 of the byproducts treating device in FIG. 1. Referring to FIG. 2, the forced transfer unit 100 may include a reciprocating compressive pump for transferring byproducts B to the cleaning unit 200 by alternately opening a suction valve and an exhaustion valve according to the reciprocating motion of the piston.

The reciprocating compressive pump may include a cylinder 110 having a piston therein. The piston may be linearly moved along the cylinder back and forth by an external driver. A valve unit 120 may be positioned at an upper portion thereof. The valve unit may include a suction valve 121 through which the byproducts may flow into the pump, and an exhaustion valve 122 through which the byproducts may flow outwards from the pump. A gasket 130 is interposed between the cylinder 110 and the valve unit 120 to prevent leakage of the byproducts B. An inlet unit 140 having an inlet opening 142 may be connected to the suction valve 142. A discharge unit 150 having a discharge opening 152 may be connected to the exhaustion valve 122.

The byproducts B may be transferred into the inlet unit 140 of the pump through the inlet opening 142 from the byproduct source. Then, the suction valve 121 may be opened and the byproducts B may flow into an inside of the cylinder 110. Thereafter, the suction valve 121 may be closed and the piston may move to compress the byproducts B in the cylinder 110. Thus, the byproducts B may be exhausted from the cylinder at a high pressure by opening the exhaustion valve 122 and may flow into the cleaning unit 200 through the discharge opening 152. Particularly, the discharge opening 152 may be extended and inserted into an inlet portion 201 of the cleaning unit 200. Thus, the byproducts B may be prevented from leaking from the cleaning unit 200 in spite of the high pressure applied to the byproducts B.

Particularly, the inlet portion 201 of the cleaning unit 200 may be integrally formed with the discharge opening 152 in one body. The boundary portion between the inlet portion 201 and the discharge opening 152 may be sealed off by a sealant 160, to thereby prevent further leakage of the high pressure byproducts B. Therefore, the byproducts B may directly flow into the cleaning unit 200 from the forced transfer unit 100 to the cleaning unit 200 without any additional flow lines.

Some of the byproducts B may be solidified into powders in transfer lines that may be connected to the byproduct source. This may occur, for example, as a result of changes in temperature and/or pressure.

One type of byproducts treating device which has been proposed has a plurality of flow lines between the forced transfer unit and the cleaning unit. In such a device, the powders may be stacked in the flow lines due to pressure drop in the flow line and a velocity drop caused by bent portions of the flow lines. These stacked powders decrease performance of the byproducts treating member.

However, the byproducts treating device 1000 of the present example embodiment may include no flow lines between the forced transfer unit 100 and the cleaning unit 200. Thus, operation failures of the byproducts treating device 1000 due to the stack powders may be sufficiently prevented.

In the present example embodiment, the byproducts treating device 1000 may be disclosed in such a configuration that the flux direction of the byproducts B at the inlet opening 142 may be different from that of the discharge opening 152. However, the flux direction of the byproducts B at the inlet opening 142 may be the same as that at the discharge opening 152, for example, according to the environmental requirements of the byproducts treating device 1000. In such a case, the byproducts B may flow into the forced transfer unit 100 from a top portion thereof and may flow out at a bottom portion towards the cleaning unit 200 under the forced transfer unit 100. That is, the byproducts B may be transferred from the byproduct source to the forced transfer unit 100 and may flow down to the cleaning unit 200 along a vertical direction penetrating through the forced transfer unit 100 and the cleaning unit 200.

For example, the forced transfer unit 100 may include an axial flow pump having a linear flow path. Thus, the byproducts B may flow along the linear flow path when flowing through the forced transfer unit 100 and the cleaning unit 200. Thus, no speed reduction caused by a change of the flow path may occur when flowing through the forced transfer unit 100 and the cleaning unit 200. Therefore, the likelihood of a formation of a powder stack may be reduced or prevented in the byproducts treating device 1000 due to the linear flow path between the forced transfer unit 100 and the cleaning unit 200.

The cleaning unit 200 may include a heater 210 for heating the byproducts B, to thereby separate the byproducts B into powders and byproduct gases, a coolant 220 for cooling the powders and the byproduct gases, and a collector 230 for collecting the powders and finally removing the collected powders out of the byproducts treating device 1000.

The byproducts B flowing into the cleaning unit 200 through the inlet opening 201 may be heated by the heater 210 (e.g., an electric heater), and thus the byproducts B may be separated into the powders and the byproduct gases.

The byproducts B transferred from the byproduct source may include various toxic materials and pollutants harmful to natural environments. These materials and pollutants may need to be cleaned or purified through a proper cleaning process according to their properties. For example, when toxic materials and pollutants have good combustibility, the byproducts may be heated into combustion gases having no toxic materials and/or pollutants. In contrast, when the byproducts have good solubility with respect to a specific solvent, the byproducts may be solved into the specific solvent to thereby be formed into a solution having no toxic materials and the pollutants. Further, the byproducts may be cleaned up by chemical reactions with neutralizing materials.

In the present example embodiment, the byproducts may be cleaned by a dry scrubber in which the byproducts B are heated or combusted. However, the byproducts may also be cleaned up by a wet scrubber or a chemical scrubber. In the case of a wet scrubber, the byproducts B may be solved into the specific solvent. In the case of a chemical scrubber, the byproducts B may be neutralized into neutralization materials by chemical reactions.

The byproducts B flowing into the cleaning unit 200 through the inlet opening 201 may be heated by the heater 210. Thus, byproducts B may be separated into powders and byproduct gases. The powders may be generated due to temperature and/or pressure drops while byproducts B may flow to the cleaning unit 200. The byproducts B may include the powders in a solid state and the byproduct gases in a gas state.

The heater 210 may include a heat source 211 such as electric coils. The heater may heat the byproducts B to within a predetermined temperature range. According to one example, the temperature range may be from about 500° C. to about 1,000° C. Thus, the byproduct gases may be combusted into combustion gases having no toxic materials or pollutants. However, the powders may still include the toxic materials and pollutants.

The heated byproducts B may flow into the coolant 220 and the temperature of the byproducts B may be cooled down. For example, cooling water may flow around pipes through which the heated byproducts B may flow. Thus, the temperatures of the powders and the byproduct gases may be reduced. In one embodiment, the powders and the byproduct gases may be reduced to different temperatures, respectively. That is, the powder may be reduced to a first temperature facilitating the treatment of the powders, and the byproduct gases may be reduced to a second temperature facilitating the treatment of the byproduct gases. The byproduct gases may be cleaned up without the toxic materials and the pollutants by the heater 210 regardless of the powders, and may be cooled down to the second temperature at which the byproduct gases may be treated with ease in the byproducts treating device 1000.

The cooled byproducts B may flow into the collector 230, in which the cleaned byproduct gases may be discharged out of the byproducts treating device through inner lines of the collector 230. The powders which still have toxic materials and pollutants may be received into a receiving vessel. Thus, the byproduct gases and the powders may be separated from each other in the collector 230.

For example, the collector 230 may include a filter 231 for filtering the powders from the cooled byproducts B, a vibrator 232 generating vibration for falling down the powders that may be stacked on the filter 231, and a receiving vessel 233 receiving the falling powders. That is, the powders of the cooled byproducts B may be filtered by the filter 231, and the byproduct gases may pass through the filter 231 and may flow toward the controller 300 through the inner lines of the collector 230.

The vibrator 232 may periodically generate vibration and, thus, the filtered powders may be vibrated on the filter 231. The powders may therefore be separated from the filter 231 and may fall down to the receiving vessel 233. That is, the powders may be collected to the receiving vessel 233. The collected powders in the receiving vessel 233 may be discarded out of the byproducts treating device 1000. An additional cleaning process may be performed on the powders, for example, in the chemical scrubber and/or the wet scrubber in an exterior of the byproducts treating device 1000. In case that the powders may have no toxic materials and pollutants, the receiving vessel receiving the powders may be drawn out of the byproducts treating device 1000 and may be discarded without any additional cleaning processes.

The byproduct gases may flow into the controller 300 and may be discharged from the byproducts treating device 1000 through a discharge line. The discharge line may be selected by the controller 300 according to the flux of the byproduct gases.

Figure 3:
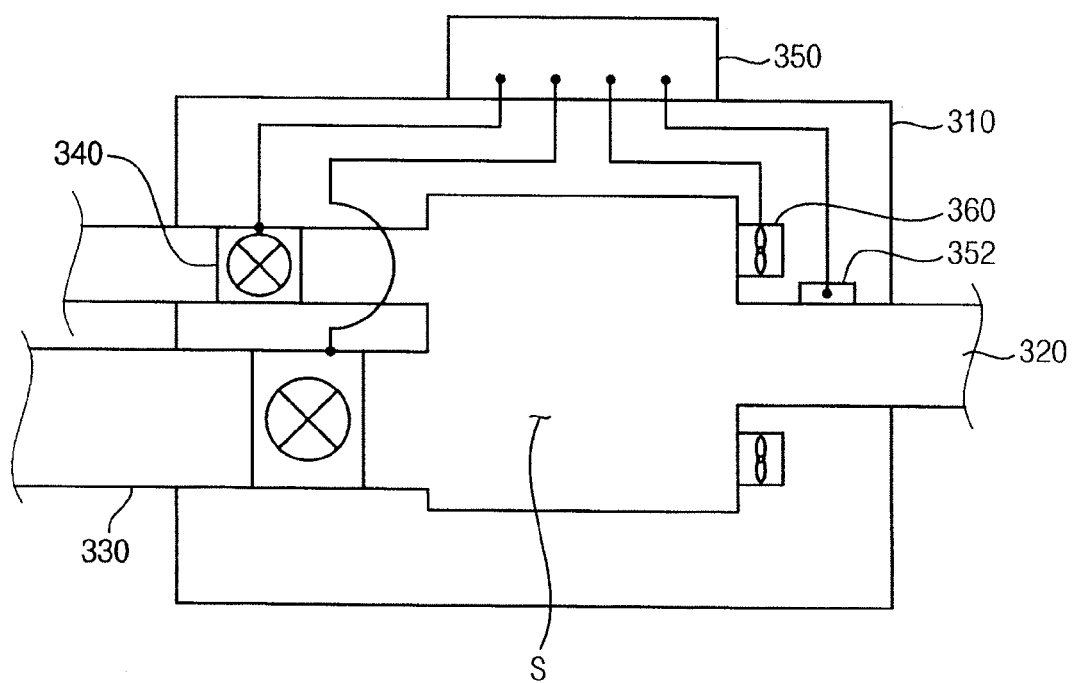
FIG. 3 illustrates an example of a controller of the byproducts treating device.

FIG. 3 is a cross-sectional view of an example of a controller of the byproducts treating device shown in FIG. 1. Referring to FIG. 3, the controller 300 may include a body 310 having a buffer space S therein, a control line 320 through which the byproduct gases may flow to the buffer space S from the cleaning unit 200, and a plurality of discharge lines 330 having different size and through which the byproduct gases may be discharged out of the byproduct treating device 1000 from the buffer space S. The controller 300 may also include a plurality of line openers 340 arranged on and for selectively opening the discharge lines, respectively, according to a control signal. A signal generator 350 may be connected to the line opener 340 to generate the control signal for opening at least one of the discharge lines according to the flux of the byproduct gases flowing through the control line 320.

For example, the body 310 may have a predetermined rigidity and the buffer space S therein. The byproduct gases passing through the filter 210 may supplied to the buffer space S through the control line 320. A plurality of the discharge lines having different sizes may communicate with the buffer space S. Thus, the byproduct gases may flow from the control line 320 to the discharge lines 330 in a medium of the buffer space S.

The flux of the byproduct gases flowing in the control line 320 may be detected by the signal generator 350. At least one of the discharge lines, having a size for efficiently discharging the detected flux of the byproduct gases, may be determined as a selected line. The line opener on the selected line may be controlled to be open and the path openers on the other lines may be controlled to be still closed. Accordingly, the byproduct gases may be discharged from the byproducts treating device 1000 through the control line 320 and the selected line(s) that may be at least one of the discharge lines 330. The buffer space has a sufficient volume for holding the byproduct gases for a time when the selection line may be selected among the discharge lines 330 by the signal generator 350.

For example, the line opener 340 may include a stop valve arranged on the discharge line 330 and driven by a control motor. The signal generator 350 connected to the line openers 340 may be arranged on the body 310. The control motor for driving the stop valve may be connected to the signal generator 350 and may be selectively operated according to the control signal from the signal generator 350. Thus, the stop valve may be selectively operated due to the selective operation of the control motor. The line opener 340 may be selectively operated by the stop valve. Accordingly, the discharge lines may be selectively opened or closed by the line opener 340.

The signal generator 350 may include a detector 352 arranged on the control line 320 for detecting the flux of the byproduct gases flowing through the control line 320. The signal generator 350 may also include a control chip for selecting the selection line among the discharge lines 330 according to the detected flux of the byproduct gases and generating the control signal to open the line opener 340. The control signal may be transferred just to the line opener of the selection line and no control signal may be applied to the other discharge lines except for the selection line. Thus, just the selection line may be opened and the byproduct gases may be discharged only through the selection line. Accordingly, the byproduct gases may be discharged through the selection line selected among the discharge lines in view of the flux of the byproduct gases, and the byproduct gases may be efficiently discharged irrespective of the flux thereof.

While the selection line in the present example embodiment may be selected from the plurality of the discharge lines by the selective operation of the line opener 340, a single discharge line may also be used for discharging the byproduct gases in place of the plurality of the discharge lines. That is, a sufficiently large-sized discharge line may be connected to the buffer body S, and a flow controller may be installed to the single discharge line. The flow controller may control the flux of the single discharge line continuously. Thus, the amount of byproduct gases discharged from the buffer space S through the single discharge line may be continuously controlled in view of the detected flux of the control line 320. For example, the flow controller may include a throttle valve and an adjustable characteristic (AC) valve that may be installed on the single discharge line.

Additionally, a supplemental fan 360 may be installed inside the body 310, so that the residuals of the byproduct gases in the buffer space S may be forced to flow toward the discharge lines 330. That is, the supplemental fan 360 may be positioned on an inner surface of the body 310 in such a configuration that the supplemental fan 360 may face the selection line, so that residuals of the byproduct gases may be blown toward the selection line by the supplemental fan 360 to thereby increase the discharge efficiency of the byproduct gases.

The forced transfer unit 100, the cleaning unit 200, and the controller 300 may be contained in the housing 400 and may be protected from surroundings. For example, the cleaning unit 200 and the controller 300 may be arranged inside a lower housing 410. The forced transfer unit 100 may be arranged inside an upper housing 420 positioned on the lower housing 410. Thus, the forced transfer unit 100, the cleaning unit 200, and the controller 300 may be protected from dust and particles of the surroundings. A vibration absorbent may be further provided between the lower and the upper housings 410 and 420. Thus, the vibrations of the forced transfer unit 100 may be sufficiently prevented from transferring to the lower housing 410.

A drawer 411 may be arranged on a bottom of the lower housing 410. The receiving vessel 233 may be arranged on the drawer 411, and the drawer may be pulled out of the byproducts treating device 1000. Thus, the powders collected in the receiving vessel 233 may be carried out of the byproducts treating device 1000 by pulling out the drawer 411.

A position regulator 412 may be arranged on the bottom of the lower housing 410 to adjust the height of the body 310 of the controller 300 with respect to the inner lines of the collector 230. The position regulator 412 may include a base plate 412a, a movable column 412b, and a support 412c. The base plate 412a may be secured to the bottom of the lower housing 410. The movable column 412b may be movably combined to the base plate 412a to move along a vertical line in such a way that the length of the movable column 412b from the base plate 412a may be variable according to the vertical movement. The support 412c may be secured to a top portion of the movable column 412b and may support the body 310. Thus, the vertical position of the body 310 may be determined by the height of the movable column 412b.

In the present example embodiment, the control line 320 and the discharge lines 330 may have the same height from the bottom of the lower housing 410. Thus, the flow path of the byproduct gases may not change along the vertical direction in flowing through the control line 320 and the discharge lines 330. The heights of the control line 320 and the inner lines of the cleaning unit 200 may be different from each other according to the height of the receiving vessel 233. Thus, the vertical variation of the flow path may occur when the byproduct gases flow into the controller 200 from the cleaning unit 200. In such a case, the vertical position of the body 310 may be controlled by adjusting the height of the support 412c in such a way that the height of the control line 320 may be the same as that of the inner lines of the collector 230 of the cleaning unit 200. Both the control line 320 and the inner lines of the collector 230 may be parallel with the bottom of the lower housing 410. The height of the support 412c may be adjusted by the vertical movement of the movable column 412b.

The discharge lines 330 may be arranged in parallel with the bottom of the lower housing 410. Particularly, the height of the discharge lines 330 may be the same as that of the control line 320. As a result, the byproduct gases may be discharged from the byproducts treating device 1000 in parallel with the bottom of the lower housing 410, and without any vertical changes of the flow path of the byproduct gases from the inner lines of the collector 230 to the selection line via the control line 320. Accordingly, the flow velocity of the byproduct gases may be prevented from being reduced at points where the flow path may change vertically. In addition, if residuals of the powders remain in the byproduct gases, the residual powders may also be prevented from stacking at the points where the flow path changes.

The byproducts B in the byproduct source may have various toxic materials and pollutants harmful to the environment. The byproducts B may be supplied to the cleaning unit 200 from the byproduct source under various environmental experiences. The powders may be sufficiently removed from the byproducts B by the cleaning unit 200. However, an additional cleaning unit may be needed for sufficiently removing the powders, as well as cleaning unit 200 according to the compositions of byproducts B.

In such a case, the discharge lines 330 of the controller 300 may be connected to a supply line of the additional cleaning unit. Particularly, the discharge lines connected to the supply line of the additional cleaning unit may also be arranged in parallel with the bottom of the lower housing 410. Thus, no further vertical path changes may occur in the discharge lines 330, thereby minimizing the powder stack at points where the discharge lines 330 bend along a direction perpendicular to the bottom of the lower housing 410.

Further, a discharging accelerator 500 may be coupled to the byproducts treating device 1000, to thereby increase the discharge efficiency of the discharged byproduct gases. For example, the discharge line 330 may extend out of the byproducts treating device 1000. The discharging accelerator 500 may include a pumping system or a blowing system that may be arranged on the extended portion of the discharge lines 330. When the byproduct gases are sufficiently cleaned by the cleaning unit 200, the discharging accelerator 500 may be installed at an end portion of the discharge line 330. The byproduct gases may then be rapidly discharged to the atmosphere by the discharge accelerator 500.

In contrast, when the byproduct gases are insufficiently cleaned by the cleaning unit 200, an additional cleaning process in the additional cleaning unit may be needed for cleaning the byproduct gases. The discharging accelerator 500 may be interposed between the discharge line 330 and a supply line to the additional cleaning unit, thereby increasing the supply efficiency to the additional cleaning unit.

Various units or equipment may be added to the byproducts treating device 1000, thereby configuring a hybrid byproducts treating device satisfying various environmental conditions.

Figure 4A:
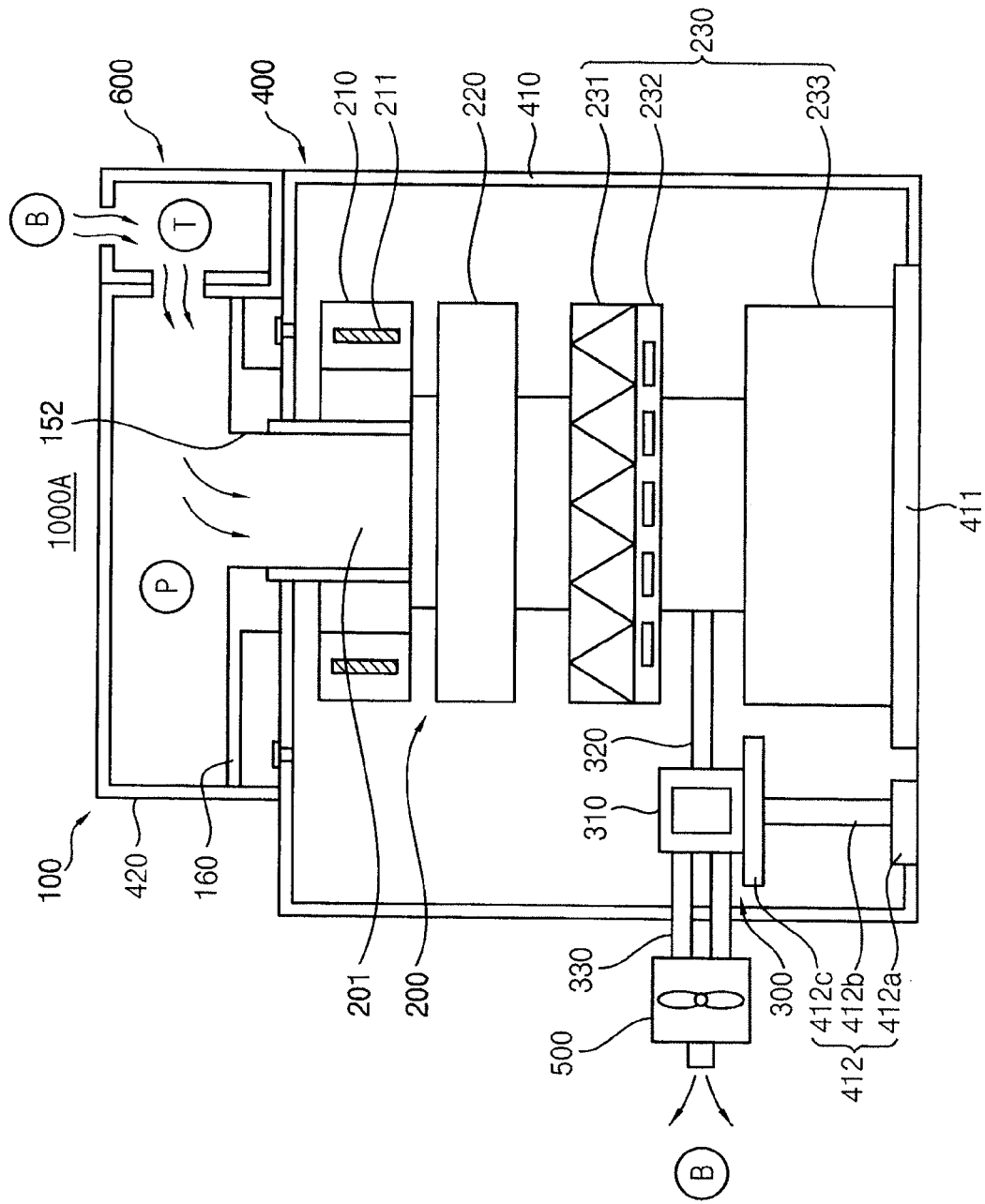
FIG. 4A illustrates a first modification of the byproducts treating device.
Figure 4B:
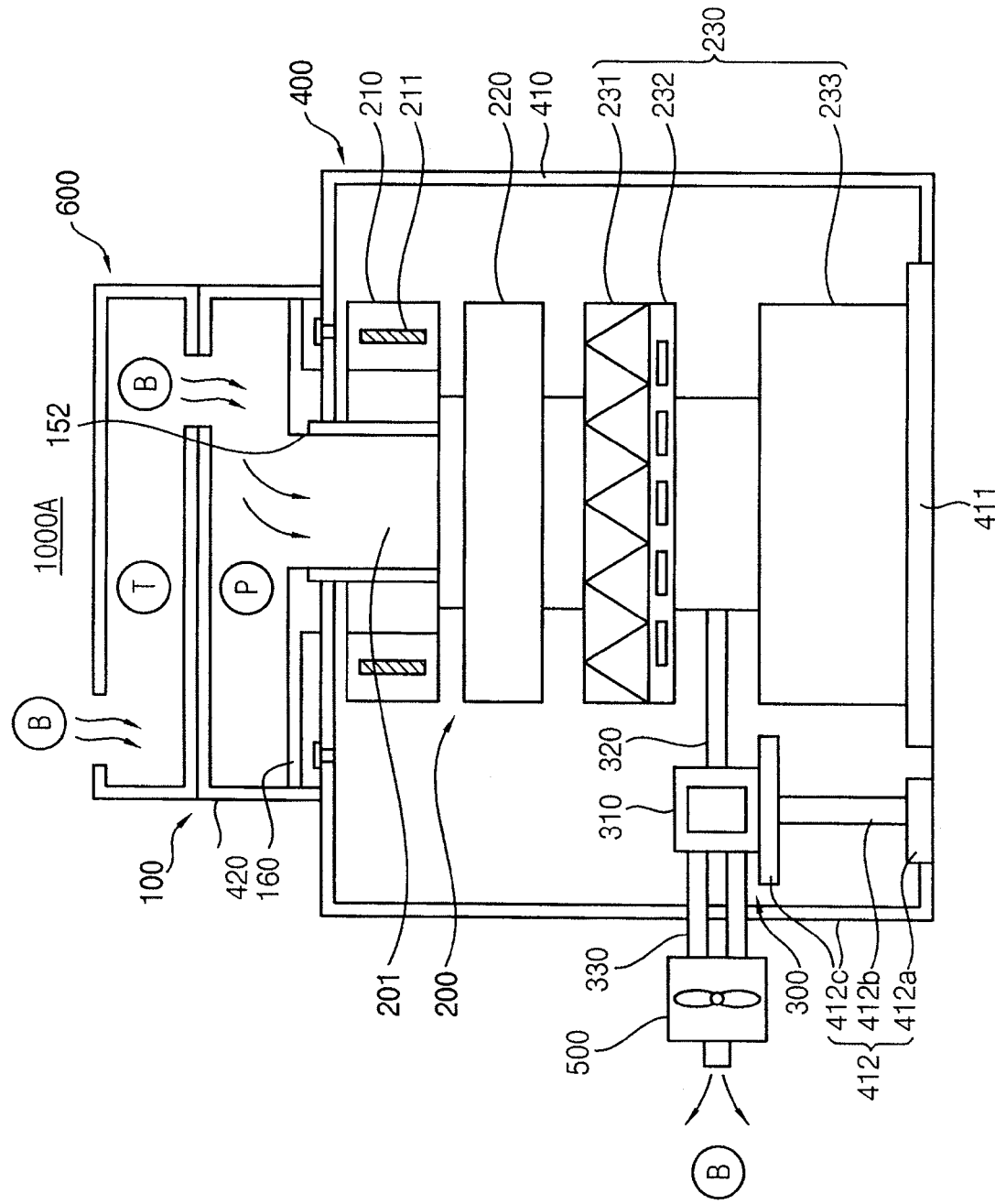
FIG. 4B illustrates a second modification of the byproducts treating device.

FIG. 4A illustrates a first modification of the byproducts treating device in FIG. 1, and FIG. 4B illustrates a second modification of the byproducts treating device in FIG. 1. Referring to FIGS. 4A and 4B, the first modification 1000A of the byproducts treating device 1000 may include a trap unit 600 for preliminary collection of the powders from the byproducts B before being supplied to the forced transfer unit 100. In one embodiment, the trap unit 600 may be integrally configured to the forced transfer unit 100 in one body, without any pipe lines between the trap unit 600 and the forced transfer unit 100.

The powders may be removed from the byproducts B by trap unit 600 before the byproducts B are supplied to the forced transfer unit 100. The amount of the powders filtered in the cleaning unit 200 may therefore be sufficiently reduced to improve the cleaning quality of the cleaning unit 200. When a large amount of the powders is generated between the byproduct source and forced transfer unit 100 (due to environmental variations such as a environmental temperature drop) and the powders are sufficiently removed from the byproducts B in the trap unit 600, the cleaning unit 200 may be intensively focused to the cleaning process of the byproduct gases. This may improve the cleaning quality of the first modification 1000A as compared with the cleaning quality of the byproducts treating device 1000.

In addition, the toxic materials and pollutants cleaned off from the byproducts B in the trap unit 600 may be controlled to be different from those cleaned off from the byproducts B in the cleaning unit 200. Various toxic materials and pollutants may therefore be removed from the byproducts B by the trap unit 600 and the cleaning unit 200. Accordingly, the cleaning quality may be significantly improved as well as the cleaning quantity in the first modification 1000A.

In such a case, an outlet of the trap unit 600 may be detachably coupled to the inlet opening 142 of the forced transfer unit 100. The boundary portion of the trap unit 600 and the forced transfer unit 100 may be sufficiently sealed by an additional sealant, so that any further supply lines such as pipe lines may be needed between the trap unit 600 and the forced transfer unit 100. Thus, the powders may be prevented from stacking in the supply line to the forced transfer unit 100. Operation failures of the trap unit 600 may therefore be prevented as a result of stack powders in the supply line to the forced transfer unit 100 from the trap unit 600. In the present example embodiment, the trap unit 600 may be arranged in the upper housing 420 together with the forced transfer unit 100 in one body. However, the trap unit 600 may also be individually installed at a side portion or an upper portion of the forced transfer unit 100 in view of the installation requirements and usage environments of the first modification 1000A.

When the byproducts B flow downwards without any flow path changes from the byproduct source to the forced transfer unit 100 via the trap unit 600 as shown in FIG. 4B, the powders may be relatively less stacked in the forced transfer unit 100 and the trap unit 600. For those reasons, the trap unit 600 may be arranged on an upper portion of the forced transfer unit 100, rather than a side portion of the forced transfer unit 100.

When the trap unit 600 is combined with the forced transfer unit 600 in one body, no stack powders may be generated between the trap unit 600 and the forced transfer unit 100. This is because no supply lines are provided between the trap unit 600 and the forced transfer unit 100. In addition, the cleaning quality and quantity may be significantly improved due to the trap unit 600 in the first modification 1000A, as compared with the byproducts treating device 1000 as in FIG. 1.

According to the byproducts treating device of the present example embodiment, the forced transfer unit 100 and the cleaning unit 200 may be configured into one body without any flow lines therebetween. Thus, the byproducts B may directly flow into the cleaning unit 200 from the forced transfer unit 100. Therefore, the path changes of the byproducts flow caused by the modifications of the flow lines may not occur. Thus, a drop in the flow rate of the byproducts flow may be prevented in the byproducts treating device. As a result, powders may be sufficiently prevented from building up in the byproducts treating device. In addition, the size of the discharge line may be automatically varied according the flux of the byproducts flow of the cleaning unit, Thus, the byproduct gases may be discharged from the byproducts treating device without any decrease in flow rate, although the flux of the byproduct gases may rapidly increase.

FIG. 5 illustrates an embodiment of a method of treating byproducts in a byproducts treating device, such as shown in FIG. 1. Referring to FIG. 5, the process byproducts B may be generated in an external byproduct source. Then, the byproducts B may flow into the forced transfer unit 100 (operation S100). The byproduct source may include a process chamber of a unit for manufacturing a semiconductor device.

For example, the byproducts B may be pumped out of the byproduct source to the byproducts treating device 1000 by a pumping system, such as a reciprocal compressive pump. Various valves and pipe lines may be arranged between the byproduct source and the forced transfer unit 100 of the byproducts treating device 1000. Thus, the byproducts B may flow into the forced transfer unit 100 through the pipe lines and valves. The byproducts B may include various toxic materials and/or pollutants harmful to the environment.

Particularly, a preliminary cleaning process may be performed to the byproducts B before the byproducts B may flow into the forced transfer unit 100. For example, a powder collector, such as a trap device, may be arranged between the byproduct source and the forced transfer unit 100. Thus, the powders in the pipe lines may be removed in advance from the byproducts B between the forced transfer unit 100 and the byproduct source.

For example, the same toxic materials as removed from byproducts B in the cleaning unit 200 may be removed in the trap device. As a result, a supplemental cleaning process may be performed in the trap device before a principal cleaning process is performed in the cleaning unit 200. Otherwise, the trap device may remove toxic materials that are different from those removed from the byproducts B in the cleaning unit 200. Thus, the cleaning process in the trap device may be performed independently from the cleaning process performed in the cleaning unit 200. In such a case, a double cleaning process may be performed in the byproducts treating device 1000.

The byproducts B may be directly supplied into the cleaning unit 200 without any flow lines (operation S200). The discharge opening 152 of the forced transfer unit 100 may be directly combined with the inlet opening 201 of the cleaning unit 200, so that the byproducts B in the forced transfer unit 100 may be flowed into the cleaning unit 200 without any flow lines therebetween. Therefore, the powders in the byproducts B may be prevented from stacking up in the flow lines. Also, operation failures of the byproducts treating device 1000, due to stacked powders in the flow lines between the forced transfer unit 100 and the cleaning unit 200, may be sufficiently prevented.

The byproducts B may be separated into the powders and the byproduct gases in the cleaning unit 200. The toxic materials and the pollutants in the byproducts B may be cleaned off through two routes (operation S300), e.g., through removal of the powders and/or the combustion of the byproduct gases. The byproducts B may be heated by the heater 210 and may be into separated into the byproduct gases and the powders in a solid state.

The compositions of the byproduct gases and powders may be varied according to the toxic materials and the pollutants. The byproduct gases may be heated or combusted by the heater 210 and the toxic materials or the pollutants may be cleaned off from the byproducts B as combustion gases. The powders may remain in the cleaning unit 200 irrespective of heating of the byproduct gases. After heating the byproducts B, the byproducts B may be separated into the byproduct gases from which the toxic materials and the pollutants may be removed and the powders in which the toxic materials and the pollutants may still included.

The heated byproduct gases and powders may be supplied into the coolant 220, and the temperatures of the byproduct gases and the powders may be cooled down. Thereafter, the byproduct gases and powders may be supplied to the collector 230. Particularly, the heater 210, the coolant 220, and the collector 230 may be stacked in a vertical direction Thus, the byproduct gases and powders may move downwards, sequentially passing though the heater 210, the coolant 220, and the collector 230.

The powders may be filtered by the filter 231 of the collector 230, and then may be collected in the receiving vessel 233 of the collector 230. The byproduct gases may pass through the filter 231 and may be supplied to the control line 320 of controller 300.

The receiving vessel containing the powders may be drawn out of the byproducts treating device 1000. Then, the powders may be treated in an additional safety facility at an exterior of the byproducts treating device 1000, to thereby remove the powders from the byproducts B (operation S400). Therefore, the toxic materials and the pollutants in the powders may be removed from the byproducts B together with the powders by the byproducts treating device 1000, thereby cleaning the byproducts B in the byproducts treating device 1000.

In contrast, the byproduct gases may be removed from the byproducts treating device 1000 through the selection line. The selection line may be selected among the discharge lines according to the flux of the byproduct gases in the control line 320 (operation S500).

Particularly, the byproduct gases may flow into the control line 320 through the inner lines of the collector 230, and thus may be supplied into the buffer space S of the body 310 of the controller 300. When the byproduct gases flow through the control line 320, the flux of the byproduct gases may be detected by the detector 352 of the signal generator 350. At least one of the discharge lines 330 may be selected as the selection line by the signal generator 350. Then, the byproduct gases may be discharged from the byproducts treating device 1000 through the selection line. That is, the toxic materials and pollutants may be removed from byproducts B by combustion. The combusted byproduct gases may be removed from the cleaning unit 200 through the selection line, thereby cleaning the byproducts B in the byproducts treating device 1000.

Figure 6:
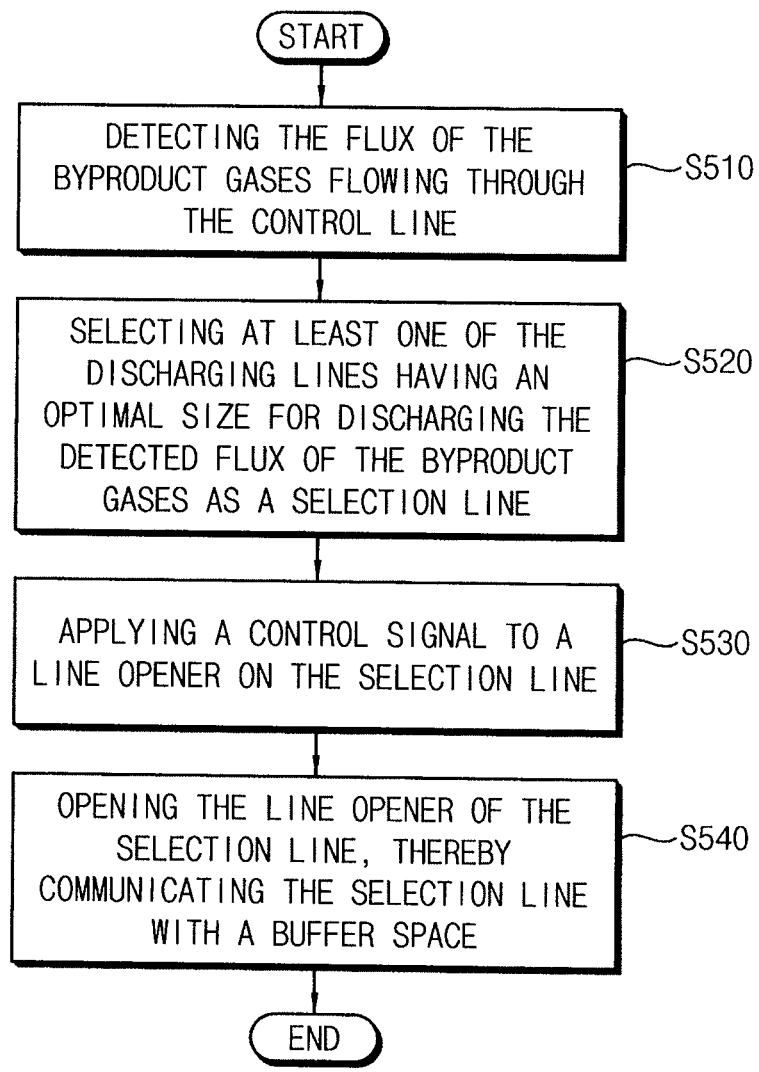
FIG. 6 illustrates operations for removing byproduct gases in FIG. 5.

FIG. 6 illustrates an example of sub-operations for the operation of removing the byproduct gases shown in FIG. 5.

Referring to FIG. 6, the flux of the byproduct gases may be detected by the detector 352 of the signal generator 350 (operation S510). For example, the detector 352 may be arranged on the control line 320 and may be controlled by the control chip of the signal generator 350. The control chip may be electrically connected to the detector 352. Thus, the detector 352 may detect the flux of the byproduct gases under control of the signal generator 350. Then, the detected flux may be compared with the sizes of the discharge lines 330. Information on the sizes of the discharge lines may be stored in the control chip.

At least one of the sizes of the discharge lines 330 relatively most sufficient for discharging the detected flux of the byproduct gases may be selected as an optimal size corresponding to the detected flux. The discharge line 330 having the optimal size may be selected as the selection line (operation S520). For example, diameters of the discharge lines 30 may be stored as the sizes of the discharge lines 330. At least one of the diameters of the discharge lines 330 may be selected as the optimal diameter corresponding to the detected flux of the byproduct gases. Then, the discharge line 330 having the optimal diameter may be selected as the selection line by the signal generator 350.

The control signal may be generated from the signal generator 350 and applied to the line opener 340 positioned on the selection line (operation S530). According to the control signal, the line opener 340 may be opened and the selection line may be communicated with the buffer space S of the body 310 (operation S540).

For example, a stop valve may be installed in each of the discharge lines 330. The control signal may be individually transferred to each stop valve by the signal generator 350. Thus, when the control signal is applied to the stop valve, the stop valve may be controlled to be open. Thus, the discharge line 330 corresponding to the opened stop valve may be opened and communicated with the buffer space S. That is, the discharge line 330 corresponding to the opened stop valve may be selected as the selection line.

When the control signal is not applied to the stop valve, the stop valve may still remain closed and the discharge line 330 corresponding to the closed stop valve may be closed by the stop valve. Thus, the discharge line 330 that may be closed by the stop valve may not be communicated with the buffer space S. Accordingly, the discharge line 330 that may be opened by the stop valve may be the only discharge line communicated with the buffer space S of the body 310.

Therefore, the byproduct gases may be discharged from the cleaning unit 200 just through the selection line. The size of the selection line may be automatically controlled to be sufficient for the flux of the byproduct gases in the control line 320. Thus, the unexpected increase of the flux of the byproduct gases may not cause the drop of the flow rate of the byproduct gases, due to selection of the selection line in view of the byproduct gases flux of the control line 320. In the present example embodiment, the discharge lines 330 may include a first pipe line having a diameter of about 100 mm to about 110 mm. A second pipe line having a diameter of about 200 mm to about 210 mm.

The byproduct gases may be discharged to surroundings such as the atmosphere through the selection line. Otherwise, the byproduct gases may be discharged to an additional cleaning unit for performing an additional process. Particularly, the byproduct gases may be efficiently discharged from the cleaning unit 200 by the discharging accelerator 500 such as a blowing system and a pumping system, thereby improving the discharging efficiency of the byproduct gases.

According to the method of treating the byproducts of a process, the forced transfer unit and the cleaning unit may be configured into one body without any flow lines therebetween. Thus, the byproducts of a process may directly flow into the cleaning unit from the forced discharging unit. Therefore, path changes of the byproducts flow caused by the modifications of the flow lines may not occur. The drop of the flow rate of the byproducts flow may therefore be prevented in the byproducts treating device. As a result, the powders may be sufficiently prevented from building up in the byproducts treating device, thereby increasing the efficiency of treating the process byproducts. In addition, the size of the discharge line may be automatically varied according to the flux of the byproducts flow of the cleaning unit. Thus, the byproduct gases may be discharged from the byproducts treating device without any decrease in flow rate, although the flux of the byproduct gases may be rapidly increased.

Figure 7:
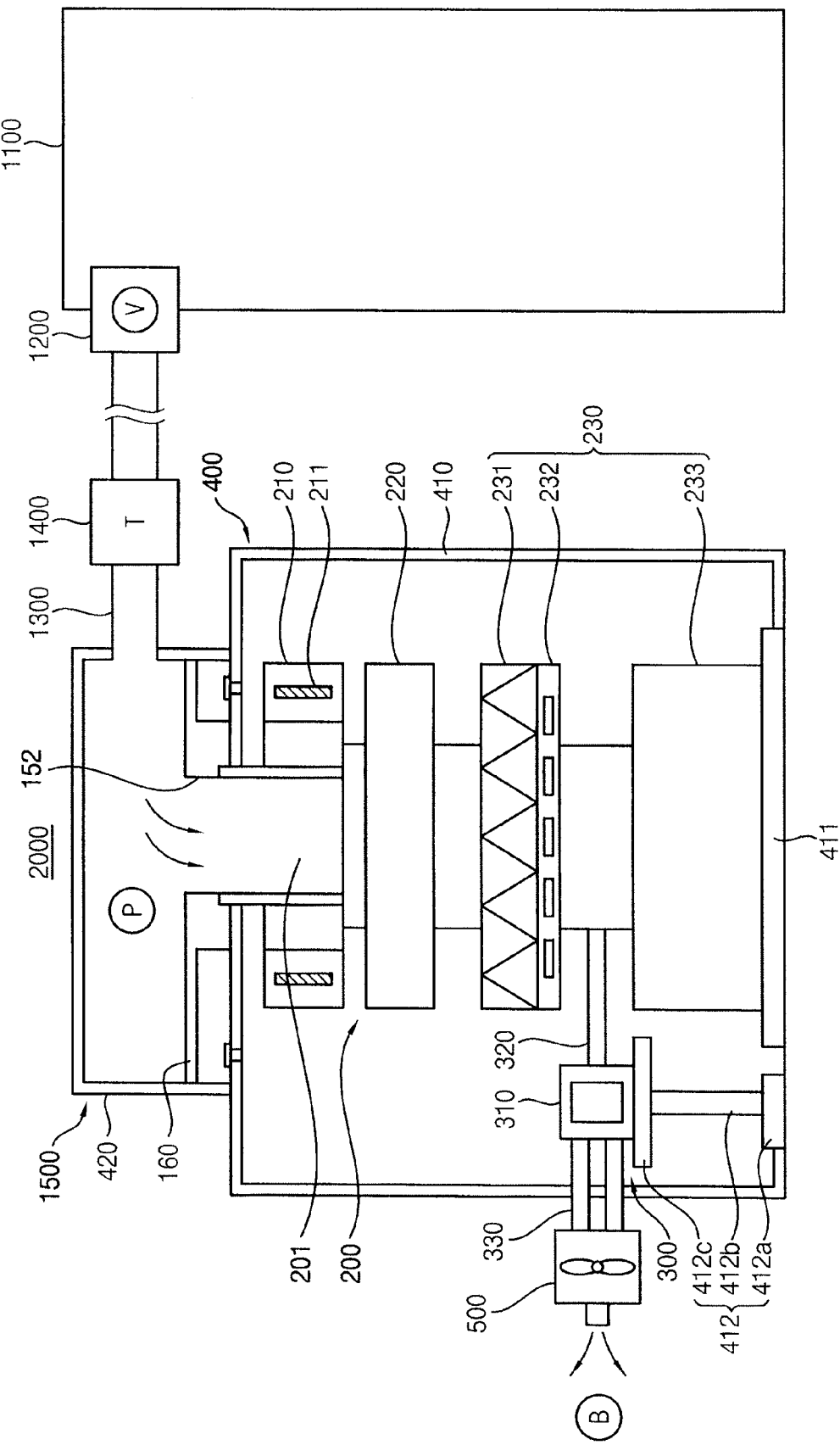
FIG. 7 illustrates an embodiment of a facility for manufacturing semiconductor devices which includes a byproducts treating device.

FIG. 7 illustrates an embodiment of a facility for manufacturing semiconductor devices including the byproducts treating device shown in FIG. 1. Referring to FIG. 7, the facility for manufacturing semiconductor devices 2000 (hereinafter, referred to as manufacturing facility) may include a process chamber 1100 in which a process may be performed using source materials. Byproducts may be generated as a result of the process.

The manufacturing facility may also include an emission member 1200 for emitting the byproducts out from the process chamber 1100, and a byproducts treating member 1500 for treating the byproducts to thereby remove toxic materials and pollutants. The byproducts treating member 1500 may have substantially the same structures as the byproducts treating device 1000 shown in FIG. 1.

The byproducts treating member 1500 may include a forced transfer unit 100, a cleaning unit 200, and a controller 300. The forced transfer unit forcibly transfers the emitted byproducts. The cleaning unit 200 is directly combined with the forced transfer unit 100 in such a configuration that the byproducts directly flow from the forced transfer unit 100 without flow lines. The byproducts are separated into powders and byproduct gases. The controller 300 is connected to the cleaning unit 200 and selects a selection line for discharging the byproduct gases according to a flux of the byproduct gases. The byproducts treating member 1500 also includes a housing 400 containing the forced transfer unit 100, the cleaning unit 200, and the controller 300. The forced transfer unit 100, the cleaning unit 200, and the controller 300 may be protected from surroundings by the housing 400.

The unit process for manufacturing semiconductor devices may be performed in the process chamber 1100. Various structures may be arranged in the process chamber 1100. For example, when a plasma etching process is performed in the process chamber 1100, a shower head may be at an upper portion of the process chamber. An exterior source supplier may be connected to the shower head and inject source gases into the process chamber 1100. An electrostatic chuck at a lower portion of the process chamber 1100 secures a substrate such as a wafer thereon. An electrode structure under the electrostatic chuck and over the shower head transforms the source gases into a plasma state by applying high frequency power to the source gases in the process chamber 1100.

While the present example embodiment discloses the process chamber for a unit process for manufacturing semiconductor devices, different types of chambers may be provided in other embodiments. For example, a process chamber for manufacturing liquid crystal display (LCD) devices may be used as the process chamber 1100. The substrate may be treated by a plasma process using source materials. In addition, the process chamber may be another kind for manufacturing semiconductor devices, such as but not limited to an etching process chamber, a deposition process chamber, an ion implantation process chamber, or a cleaning process chamber.

When completing the process in the process chamber 1100, various chemical products and residuals of the source materials (e.g., ones that may not have reacted with the substrate) may be generated as byproducts. When a vacuum pressure is applied to the process chamber 1100 by the emission member 1200, the byproducts may be emitted from the process chamber 1100. For example, the emission member 1200 may include a first pump and a second pump. The first pump may apply a first pressure to the process chamber 1100, to thereby form a relatively lower vacuum pressure in the process chamber 1100. The second pump may apply a second pressure to the process chamber 1100, to thereby form a relatively higher vacuum pressure in the process chamber 1100.

For example, the first pump may include one or more of a rotary pump or a dry pump, and may apply a first vacuum pressure of about $1.0 \times 10^{-3}$ Torr to the process chamber 1100. The second pump may include one or more of a turbo pump, a diffusion pump, or an ion pump, and may apply a second vacuum pressure of about $1.0 \times 10^{-6}$ Torr to the process chamber 1100. The second pump may be arranged between the first pump and the process chamber 1100 and may be connected in series with the first pump and the process chamber 1100 by pumping lines. The first and the second pressures may be sequentially applied to the process chamber 1100 using a valve system. Therefore, an inner pressure of the process chamber may be gradually changed from a process chamber to the vacuum pressure. A rapid pressure drop may therefore be prevented in the process chamber 1100 by the first and the second pumps.

The byproducts emitted from the process chamber by the emission member 1200 may be transferred into the byproducts treating member 1500 through byproducts transfer line structure 1300. The byproducts transfer line structure 1300 may include a plurality of byproducts transfer lines for transferring the byproducts from the process chamber 1100 to the byproducts treating member 1500, a plurality of valves for controlling in-line pressures of the supply lines and flux of the byproducts, and a plurality of supplemental instruments for increasing supply efficiency of the byproducts through the supply lines.

Particularly, when the byproducts treating member 1500 is spaced relatively far away from the process chamber 1100, the temperature of the byproducts and the in-line pressure of the transfer line may drop in transferring the byproducts to the byproducts treating member 1500. As a result, the byproducts may solidify into powders in the transfer lines, e.g., the flow speed and the flux of the byproducts may change in the transfer lines causing the powders to be stacked in the transfer lines.

The forced transfer unit 100 of the byproducts treating member 1500 may apply an external force to the byproducts. Thus, the byproducts may be forced to be transferred into the byproducts treating member 1500 from the process chamber 1100, together with the valves and the supplemental instruments of the transfer line structure 1300. Further, the forced transfer unit 100 may include a booster to compensate for the pressure drop of the byproducts in the transfer line, particularly when the byproducts treating member 1500 and process chamber 1100 are spaced by a relatively far distance. Therefore, the byproducts in the process chamber 1100 may be efficiently transferred to the byproducts treating member 1500 by the forced transfer unit 100.

A trap 1400 may be provided between the discharging member 1200 and the byproducts treating member 1500. Thus, powders that may be generated for a time when the byproducts are transferred through the transfer lines may be sufficiently removed. For example, the trap 1400 may be arranged in such a way that the transfer lines may penetrate through the trap 1400. The powders may therefore be removed from the byproducts when the byproducts pass through the transfer lines. Thus, a total amount of the powders of the byproducts may decrease when the byproducts reach the byproducts treating member 1500.

When the trap 1400 is arranged with the byproducts treating member in one body as shown in FIGS. 4A and 4B, a pair of traps 1400 may be arranged in the byproducts treating member 1500. Thus, the byproducts may experience a two-operation trapping process for removing the powders from the byproducts.

The byproducts treating member 1500 may have substantially the same structures as the byproducts treating device 1000 shown in FIG. 1. Thus, in FIG. 7, the same reference numerals denote the same elements in FIG. 1.

The byproducts emitted from the process chamber 1100 by the emission member 1200 may be transferred into the byproducts treating member 1500 by the forced transfer unit 100. Then, the byproducts may flow into the cleaning unit 200 positioned under the forced transfer unit 100 and be directly combined with the forced transfer unit 100 without any flow lines. Therefore, the byproducts may flow down to the cleaning unit 200 without any flow lines between the forced transfer unit 100 and the cleaning unit 200.

Since no flow line is provided between the forced transfer unit 100 and the cleaning unit 200, no changes or modifications in the shape of the flow line is required. Thus, no velocity drop of the byproducts may occur between the forced transfer unit 100 and the cleaning unit 200. Therefore, no powder stack may occur between the forced transfer unit 100 and the cleaning unit 200, thereby preventing operation failures of the byproducts treating member 1500 due to a powder stack therein. Accordingly, the facility 2000 including the byproducts treating member 1500 may be operated with high efficiency and low maintenance cost.

The byproducts may be separated into the powders and byproduct gases by the cleaning unit 200. The powders may be received in the receiving vessel 233 drawn out of the byproducts treating member 1500. Thus, toxic materials and pollutants in the powders may be removed together with the powders out of the byproducts treating member 1500. In contrast, the byproduct gases may be discharged out of the byproducts treating member 1500 through the selection line according to the flux of the byproduct gases.

The byproduct gases may flow into the buffer space S of the body 310 through the control line 320. The signal generator 350 may detect the flux of the byproduct gases passing through the control line 320. The discharge line 330 may have a size sufficient for the detected flux of the byproduct gases, and may be automatically selected as the selection line for discharging the byproduct gases to the surroundings.

As shown in FIG. 1, the controller 300 may include the body 310, control line 320, and a plurality of discharge lines 330. The body 310 has a buffer space S therein. The control line 320 is a line through which the byproduct gases flow to the buffer space S from the cleaning unit 200. The plurality of the discharge lines 330 may have different sizes and allow byproduct gases to be discharged out of the byproducts treating member 1500 from the buffer space S.

The controller 300 may also include a plurality of line openers 340 and a signal generator The plurality of line openers 340 are arranged on respective ones of the discharge lines 330 and selectively open the discharge lines 330 according to the control signal. The signal generator 350 is connected to the line opener 340 and generates a control signal for opening at least one of the discharge lines according to the flux of the byproduct gases passing through the control line 320. In the present example embodiment, the discharge lines 330 may include a first pipe line having a diameter of about 100 mm to about 110 mm, and a second pipe line having a diameter of about 200 mm to about 210 mm.

Generally, the total amount of byproducts increase in the unit process chamber for manufacturing semiconductor devices with increasing size of the wafer to be processed. In some byproduct treating devices, the size of discharge lines have not been unchanged. In such a case, the flow velocity of the byproducts may decrease in the byproducts treating member due to the relatively small size of the discharge lines and as the amount of the byproducts increases. This causes the formation of a powder stack in the discharge lines. In the present example embodiment, the size of the discharge lines 330 are automatically selected to be sufficient to handle the flux of the byproducts. As a result, the formation of powder stacks in the discharge lines 330 may be efficiently reduced.

In one embodiment of the facility for manufacturing the semiconductor devices, the byproducts treating member includes the cleaning unit configured together with the forced transfer unit in one body. Thus, the byproducts directly flow into the cleaning unit from the forced transfer unit without any flow lines. Since no flow lines are between the forced transfer unit 100 and the cleaning unit 200, no changes or modifications in a shape of the flow line is required. Thus, no drop in velocity of the byproducts occurs between the forced transfer unit 100 and the cleaning unit 200. Also, no powder stack is formed between the forced transfer unit 100 and the cleaning unit 200, to thereby prevent operation failures of the byproducts treating member due to the formation of a powder stack therein. Accordingly, facility 2000 including the byproducts treating member 1500 may be operated with high efficiency and low maintenance cost.

Figure 8:
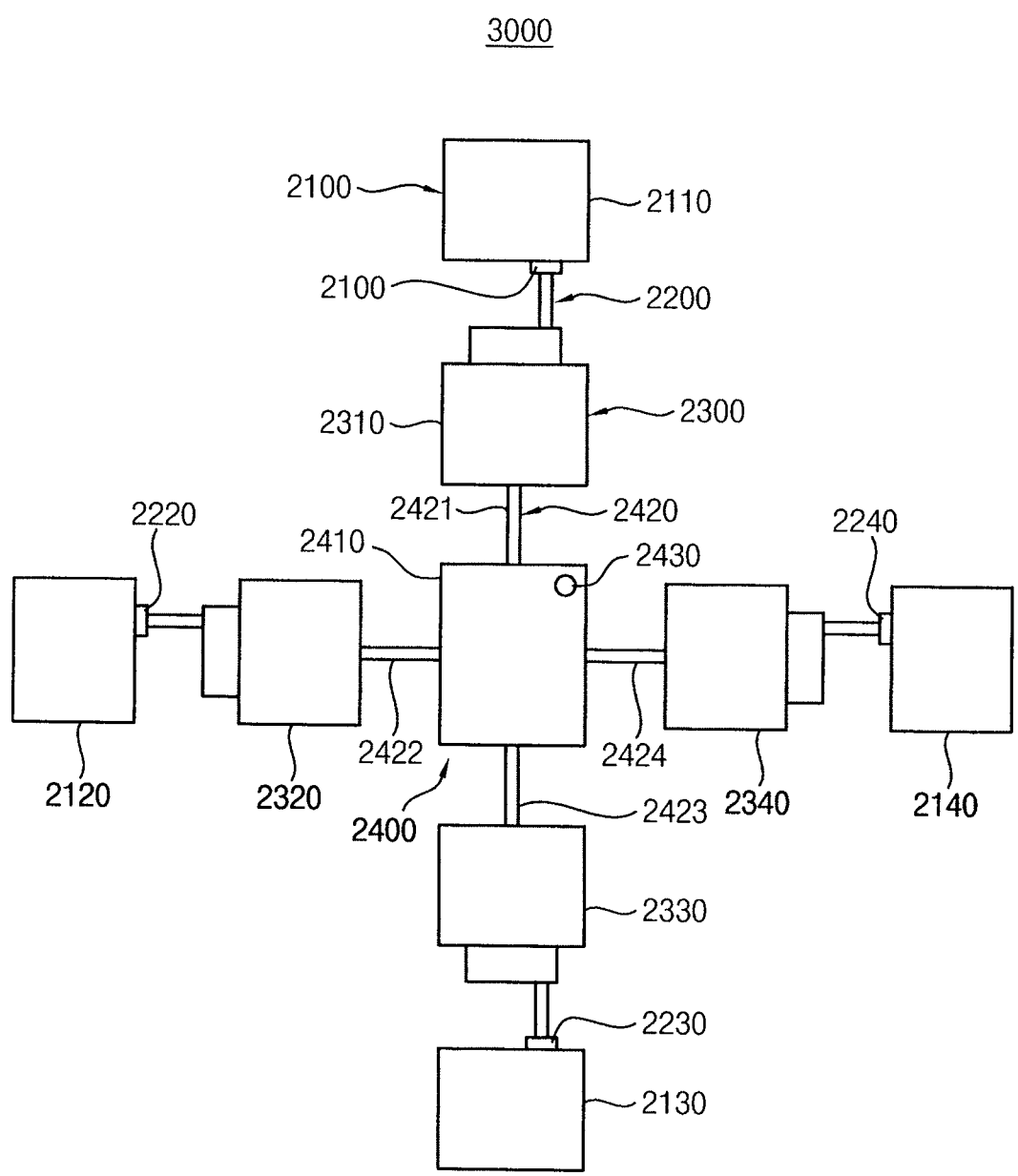
FIG. 8 illustrates another embodiment of a facility for manufacturing semiconductor devices which includes a byproducts treating device.
Figure 9:
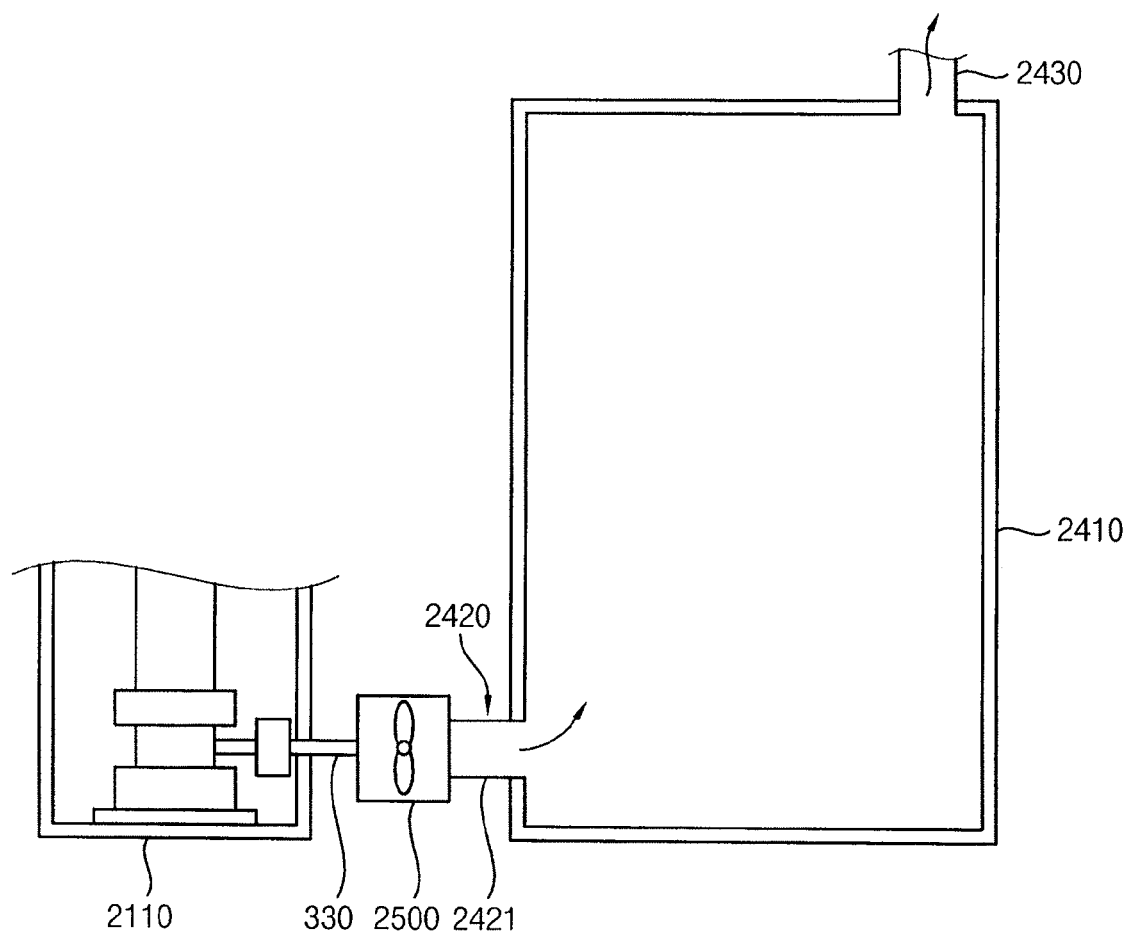
FIG. 9 illustrates an example of a connection between a first treating member and a gas collector in FIG. 8.

FIG. 8 illustrates another embodiment of a facility 3000 for manufacturing semiconductor devices including the byproducts treating device in FIG. 1, and FIG. 9 illustrates a cross-sectional view of a connection between a first treating member and a gas collector in FIG. 8.

Referring to FIGS. 8 and 9, facility 3000 includes a plurality of process chambers 2100, at least one emission member 2200, and a plurality of byproducts treating members 2300. In the process chambers 211, specific processes may be performed using respective source materials. Byproducts may be generated as a result of these processes. The at least one emission member 2200 emits the byproducts out from each process chamber 2100. The plurality of byproducts treating members 2300 treat the byproducts to thereby remove toxic materials and pollutants.

The facility 3000 also includes a gas container 2400 linearly connected to the byproducts treating members 2300 without any bent portions. The gas container 2400 receives the byproduct gases from each of byproducts treating members 2300. The byproducts treating members 2300 may have substantially the same structures as the byproducts treating device 1000 shown in FIG. 1.

In one embodiment, the byproducts treating member 2300 includes a forced transfer unit 100 for forcibly transferring the emitted byproducts. A cleaning unit 200 directly combined with the forced transfer unit 100 may also be included. The cleaning unit 200 may have a configuration to allow the byproducts to directly flow from the forced transfer unit 100 without flow lines, The cleaning unit 200 may also separate the byproducts into powders and byproduct gases.

The facility may also include a controller 300 and a housing 400. The controller 300 may be connected to the cleaning unit 200 for selecting a selection line for discharging the byproduct gases according to a flux of the byproduct gases. The housing 400 contains the forced transfer unit 100, the cleaning unit 200, and the controller 300. The forced transfer unit 100, the cleaning unit 200, and the controller 300 may be protected from surroundings by the housing 400.

For example, the process chambers 2100 may include first to fourth chambers 2110, 21120, 2130, and 2140 arranged around gas container 2400. A series of the unit processes for manufacturing the semiconductor devices may be individually performed in the first to fourth chambers 2110 to 2140. Otherwise, a series of sub-processes of a specific unit process may be sequentially performed in the first to the fourth chambers 2110 to 2140. Each of the first to fourth chambers 2110 to 2140 may have substantially the same structures as the process chamber 1100 shown in FIG. 7.

The emission member 2200 may include first to fourth pump systems 2210 to 2240 for individually pumping out the byproducts from the first to fourth chambers 2210 to 2240, respectively. Each of the first to fourth pump systems 2210 to 2240 may include a first pump and a second pump. The first pump may apply a first pressure to a respective process chamber, to thereby form a relatively lower vacuum pressure in this chamber. The second pump applies a second pressure to a respective process chamber, to thereby form a relatively higher vacuum pressure in this chamber. Each of the first to fourth pump systems 2210 to 2240 may have substantially the same structures as the emission member 1200 shown in FIG. 7.

The byproducts treating member 2300 may include first to fourth treating members 2310 to 2340 that may be individually connected to the first to fourth chambers 2110 to 2140 through the first to fourth pump systems 2210 to 2240, respectively. Each of the byproducts emitted from the respective process chambers by a corresponding pump system may be transferred into a respective treating member by the respective forced transfer unit 100.

The byproducts in each of the treating members 2310 to 2340 may flow into the cleaning unit 200 positioned under the forced transfer unit 100. The treating members may be directly combined with the forced transfer unit 100 without any flow lines. Therefore, the byproducts may flow down to the cleaning unit 200 without any flow lines between the forced transfer unit 100 and the cleaning unit 200. Each of the treating members 2310 to 2340 may have substantially the same structures as the byproducts treating device 1000 shown in FIG. 1.

In each of the treating members 2310 to 2340, the byproducts may be separated into powders and byproduct gases by the cleaning unit 200. The powders may be received in the receiving vessel 233, which may be drawn out of the treating member. Thus, the toxic materials and the pollutants in the powders may be removed, together with the powders out of the treating member. In contrast, the byproduct gases in each treating member may be gathered in the gas container 2400. Thus, all of the byproduct gases may be discharged to the atmosphere from the gas container 2400 at one time. Otherwise, the byproduct gases in the gas container 2400 may be supplied to an additional cleaning process.

The byproduct gases in each treating member 2310 to 2340 may flow into the buffer space S of the body 310 through the control line 320. The signal generator 350 may detect the flux of the byproduct gases passing through the control line 320. The discharge line 330, having a size sufficient for the detected flux of the byproduct gases, may be automatically selected as the selection line for discharging the byproduct gases to the gas container 2400. Automatic selection of the size of the discharge lines 330 sufficient for the flux of the byproducts may efficiently reduce the formation of powder stacks in the discharge lines 330.

As shown in FIGS. 1 and 3, the controller 300 may include the body 310 having the buffer space S therein, the control line 320 through which the byproduct gases may flow to the buffer space S from the cleaning unit 200, a plurality of the discharge lines 330 having different sizes and through which the byproduct gases may be discharged out of the respective treating member from the buffer space S, and a plurality of line openers 340 arranged on each of the discharge lines 330 for selectively opening the discharge lines 330, respectively. The discharge lines 330 may be opened according to a control signal. The signal generator 350 may be connected to the line opener 340 to generate the control signal for opening at least one of the discharge lines, according to the flux of the byproduct gases passing through the control line 320. The byproduct gases may be discharged through selection line from the respective treating member.

The gas container 2400 may include a container body 2410 containing the byproduct gases discharged from each of the treating members 2310 to 2340, a plurality of input lines 2420 connected to the container body 2410 and the selection line of each treating member and guiding the discharged byproduct gases to the container body 2410 from each treating member and a single output line 2430 emitting the byproduct gases to the atmosphere at a time from the container body 2410.

For example, the container body 2410 may include additional systems for treating the byproduct gases and may be enclosed by a container housing. The additional systems may include a large-volume tank for containing the byproduct gases discharged from the first to fourth treating members 2310 to 2340. All the byproduct gases discharged from the treating members 2310 to 2340 may be gathered in the tank and may be simultaneously emitted to the atmosphere.

Additional systems may include a supplemental cleaning unit for performing a supplemental cleaning process for the byproduct gases. Particularly, since the processes in each of the chambers 2110 to 2140 may be different and independent from one another, the toxic materials and the pollutants in each of the byproduct gases may be different from one another. For those reasons, the byproduct gases may include residuals of toxic materials and pollutants that may not be cleaned in each cleaning unit 200. Thus, the residuals of the toxic materials and pollutants may be removed from the byproduct gases in the supplemental cleaning unit. Therefore, the toxic materials and the pollutants may be much more sufficiently removed from the byproduct gases.

The container body 2410 may be connected to the byproducts treating member 2300 through a plurality of the input lines 2420. Particularly, the container body 2410 may be connected to the first treating member 2310 through a first input line 2421 and be connected to the second treating member 2320 through a second input line 2422. In the same way, the container body 2410 may be connected to the third treating member 23301 through a third input line 2423 and be connected to the fourth treating member 2340 through a fourth input line 2424.

Particularly, each input line 2421 to 2124 may have a size corresponding to the maximal size of the discharging lines 330 of the respective treating member. Thus, no velocity drop may occur in the input lines 2420, irrespective of the size of the respective selection line and the flux of the byproduct gases at respective control line 320. Therefore, the byproduct gases may flow into the container body 2410 without experiencing a rapid velocity drop.

In addition, the input lines 2420 may be connected to the respective selection lines on a coplanar surface without any bent portions. The container body 2410 may therefore be linearly connected to each of the treating members 2310 to 2340 without any path changes. That is, the gas container 2400 may be connected to each of the treating members 2310 to 2340 in such a way that the selection line of each treating member and the input lines 2420 of the gas container 2400 may have no gradient in a vertical direction and have no bent portions in a horizontal direction on a coplanar surface.

Therefore, the byproduct gases discharged from each of the treating members 2310 to 2340 may flow into the gas container 2400 without any vertical and horizontal path changes. Thus, no velocity drop of the byproducts may occur between the gas container 2400 and the byproducts treating member 2300. Also, no powder stack may be formed between the gas container 2400 and the byproducts treating member 2300. As a result, operation failures of the facility 3000 may be prevented by powder stack formations. Accordingly, facility 3000 including the byproducts treating member 2300 and the gas container 2400 may be operated with high efficiency and low maintenance cost.

In one embodiment, a flow accelerator 2500 may be provided between the selection line and the input lines 2420, to thereby improve flow efficiency of the discharged byproduct gases. The discharged byproduct gases may be forced to flow into the gas container 2400 through the input lines 2420 by the flow accelerator 2500. The flow accelerator 2500 may have substantially the same structures as the discharging accelerator 500 of the byproducts treating device 1000.

In one embodiment of a facility for manufacturing the semiconductor devices, the container body 2410 may be linearly connected to each of the treating members 2310 to 2340 without any path changes. The connection may be made in such a way that the selection line of each treating member and the input lines 2420 of the gas container 2400 may have no gradient in a vertical direction, and also have no bent portions in a horizontal direction on a coplanar surface. Thus, byproduct gases may be stably gathered into the gas container 2400 without the formation of powder stacks in the input lines 2420, thereby preventing operation failures of the facility due to the powder stack in the input lines 2420.

By way of summation and review, byproducts formed in the manufacture of semiconductor devices may be toxic, and therefore cause significant damage to the environment. For example, silane ($SiH_4$), ammonia ($NH_3$), nitrous oxide ($N_2O$), nitrogen monoxide (NO), phosphine ($PH_3$) and arsenic hydrogen (AsH) may be frequently used in a chemical vapor deposition (CVD) process, an ion implantation process, an etching process, and a diffusion process. The byproducts of these materials may be toxic to humans, may have corrosive properties for metals, and may even be combustible.

For those reasons, process byproducts are often discharged at a proper time from a process chamber using a vacuum pump and/or may be filtered by a cleaning system to prevent their emission to the atmosphere.

According to one technique, process byproducts are discharged through a discharge line by the vacuum pump and are guided to the cleaning system. The discharge lines may be arranged in a clean room in various configurations according to equipment requirements, such as a foot print of equipment and a cleanliness of the clean room. When the vacuum pump and the cleaning system are apart from each other, the discharge lines are usually bent at various positions due to space requirements of the clean room. Consequently, the flow path of the process byproducts may change at the bent portions of the discharge lines.

When the flow path of the byproducts change, flow velocity of the byproducts is usually reduced and the byproducts build up at the bent portion in the form of waste powders. The waste powders usually interrupt the flow of the byproducts. Thus, the emission of the byproducts may be obstructed. Also, when the discharge line is coated with the waste powders, the vacuum pump may stop and the process byproducts may not be discharged from the process chamber.

In contrast, in accordance with one or more example embodiments, a byproduct treating member and facility for manufacturing semiconductor devices having the same is provided. The byproducts treating device may include a cleaning unit configured together with a forced transfer unit in one body. Thus, the byproducts may directly flow into the cleaning unit from the forced transfer unit without any flow lines. Since no flow lines are provided between the forced transfer unit and the cleaning unit, no changes or modifications in a shape of the flow lines is required. Thus, no drop in velocity of the byproducts occurs between the forced transfer unit and the cleaning unit. Because there is not drop in velocity, the likelihood of a powder stack forming between the forced transfer unit and the cleaning unit is reduces or eliminated, thereby preventing operation failures of the byproducts treating device as a result of power build-up.

In addition, the size of the discharge line may be automatically varied according the flux of the byproducts flow of the cleaning unit. Thus, the byproduct gases may be discharged from the byproducts treating device without any decrease in the flow rate, although the flux of the byproduct gases may be rapidly increased.

Further, the selection line of each treating member and the input lines of the gas container may have no gradient in the vertical direction and no bent portions in a horizontal direction on a coplanar surface. Thus, the byproduct gases may be stably gathered into the gas container without the formation of powder stacks in the input lines. This will reduce or prevent operation failures of the facility attributed to the formation of powder stacks in the input lines.

Accordingly, the facility including the byproducts treating member and/or the gas container may have less line blocking because stacked powders will not form in the flow line, thereby increasing operating efficiency and low maintenance costs.

The present example embodiments of the memory device may be applied to various electronic systems including semiconductor devices and IC chips. Examples include telecommunication systems and storage systems, and to chemical processes in which various processes may be performed by chemical reactions with various source materials.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A byproducts treating device comprising:
   a transfer passage including a first inlet portion and a discharge portion, the first inlet portion to receive byproducts of a process from a byproduct source, the discharge portion to forcibly discharge the received byproducts;
   a cleaner to separate the discharged byproducts into a powder and a byproduct gas and including a second inlet portion, the second inlet portion of the cleaner directly combined with the discharge portion of the transfer passage such that the second inlet portion of the cleaner directly receives the discharged byproducts from the discharge portion of the transfer passage without passing through flow lines; and
   a controller, connected to the cleaner, to select at least one selection line for discharging byproduct gas based on a flux of the byproduct gas.

2. The device as claimed in claim 1, wherein:
   the transfer passage is on the cleaner; and
   the byproducts flow from the transfer passage to the cleaner in a predetermined direction.

3. The device as claimed in claim 2, wherein:
   the transfer passage includes a pump having an inlet opening and a discharge opening, the discharge opening coupled to the inlet opening;
   the cleaner is coupled to the pump; and
   a boundary portion between the inlet opening and the discharge opening is sealed.

4. The device as claimed in claim 1, wherein the cleaner includes:
   a heater to separate the byproducts into the powder and the byproduct gas;
   a coolant to cool the powder and the byproduct gas; and
   a collector to receive and remove the powder from the byproducts treating device.

5. The device as claimed in claim 4, wherein the collector includes:
   a filter to filter the powder and through which the byproduct gas passes;
   a vibration generator to apply vibrations to the filter to remove the powder on the filter; and
   a receiving vessel to receive the removed powders from the filter.

6. The device as claimed in claim 1, wherein the controller includes:
   a body having a buffer space;
   a control line through which the byproduct gas flows to the buffer space from the cleaner;
   a plurality of discharge lines having different sizes and through which byproduct gas is discharged from the buffer space;
   a plurality of line openers arranged on respective ones of the discharge lines, the plurality of line openers to selectively open respective discharge lines according to a control signal; and
   a signal generator connected to the line openers and to generate the control signal for opening at least one of the discharge lines as the selection line according to the flux of the byproduct gas flowing through the control line.

7. The device as claimed in claim 6, wherein each of the line openers include a stop valve arranged on respective ones of the discharge lines and operated by a control motor.

8. The device as claimed in claim 7, wherein the signal generator includes a detector to detect the flux of the byproduct gas.

9. The device as claimed in claim 6, wherein the controller includes a fan arranged on an inner surface of the body defining the buffer space, the fan blowing the byproduct gas toward the selection line.

10. The device as claimed in claim 6, further comprising:
    a discharging accelerator, arranged on the discharge lines, to accelerate discharge of the byproduct gas through the discharge lines.

11. The device as claimed in claim 1, further comprising:
    a trapper between the transfer passage and the byproduct source,
    wherein the trapper removes a powder included in the byproducts before the byproducts are transferred to the transfer passage.

12. The device as claimed in claim 11, wherein:
    the trapper is directly combined with the transfer passage, and
    the byproducts flow to the transfer passage from the trapper.

13. A facility for manufacturing a semiconductor device, comprising:
    a process chamber in which a process is performed using source materials and in which byproducts are generated as a result of the process;
    an emission member to emit the byproducts from the process chamber; and
    a byproducts treating member to remove toxic materials and pollutants from the byproducts, the byproducts treating member including:
    a transfer passage including a first inlet portion and a discharge portion, the first inlet portion to receive the emitted byproducts from the emission member, the discharge portion to forcibly discharge the received byproducts,
    a cleaner to separate the byproducts into a powder and a byproduct gas and including a second inlet portion, the second inlet portion of the cleaner directly combined with the discharge portion of the transfer passage in such a configuration that the byproducts directly flow from the discharge portion of the transfer passage to the second inlet portion of the cleaner without passing through flow lines, and
    a controller, connected to the cleaner, to select a selection line for discharging the byproduct gas according to a flux of the byproduct gas.

14. The facility as claimed in claim 13, wherein the transfer passage is on the cleaner, the transfer passage to allow the byproducts to flow from the transfer unit to the cleaning unit in a predetermined direction.

15. The facility as claimed in claim 13, wherein the controller includes:
    a body having a buffer space therein,
    a control line through which the byproduct gas flows to the buffer space from the cleaner,
    a plurality of discharge lines having different sizes and through which the byproduct gas is discharged from the buffer space,
    a plurality of line openers arranged on respective ones of the discharge lines, the plurality of line openers to selectively opening respective discharge lines according to a control signal, and
    a signal generator, connected to the line openers, to generate the control signal for opening at least one of the discharge lines as the selection line according to the flux of the byproduct gas flowing through the control line.

16. The facility as claimed in claim 15, wherein the discharge lines include:
   a first pipe line having a diameter of about 100 mm to about 110 mm, and
   a second pipe line having a diameter of about 200 mm to about 210 mm.

17. The facility as claimed in claim 13, wherein the byproducts treating member further includes a trapper between the transfer passage and the emission member, the trapper to remove a powder included in the byproducts before the byproducts are transferred to the transfer passage.

18. The facility as claimed in claim 13, wherein the process chamber includes one of an etching process chamber, a deposition process chamber, an ion implantation process chamber, or a cleaning process chamber.

19. A facility for manufacturing a semiconductor device, comprising:
   a plurality of process chambers in which specific processes are individually performed using respective source materials, wherein respective byproducts are generated as a result of the specific processes;
   one or more emission members to emit the byproducts from the process chambers;
   a plurality of byproducts treating members to remove at least one of toxic material or pollutants from respective ones of the byproducts; and
   a gas container linearly connected to the byproducts treating members without any bent portions, the gas container to receive the byproduct gas from each of byproducts treating members, wherein each of the byproducts treating members includes:
   a transfer passage including a first inlet portion and a discharge portion, the first inlet portion to receive the emitted byproducts, the discharge portion to forcibly discharge the received byproducts,
   a cleaner to separate the byproducts into a powder and a byproduct gas and including a second inlet portion, the second inlet portion of the cleaner directly combined with the discharge portion of the transfer passage in such a configuration that the byproducts directly flow from the discharge portion of the transfer passage to the second inlet portion of the cleaner without passing through flow lines, and
   a controller, connected to the cleaner, to select a selection line for discharging the byproduct gas according to a flux of the byproduct gas.

20. The facility as claimed in claim 19, wherein the controller includes:
   a body having a buffer space,
   a control line through which the byproduct gas flows to the buffer space from the cleaner,
   a plurality of discharge lines having different size to discharge the byproduct gas from the buffer space,
   plurality of line openers arranged on respective ones of the discharge lines, and to selectively open respective discharge lines according to a control signal, and
   a signal generator, connected to the line openers, to generate the control signal for opening at least one of the discharge lines as the selection line according to the flux of the byproduct gas flowing through the control line,
   wherein the gas container includes a plurality of input lines connected to the selection lines of the byproducts treating members in such a configuration that the byproduct gas discharged from each of the byproducts treating members are gathered into the gas container through the input lines, respectively.

21. The facility as claimed in claim 20, further comprising:
   a flow accelerator between the selection line and the input lines,
   wherein the flow accelerator forcibly supplies the byproduct gas discharged from each byproducts treating member into the gas container through the input lines.

22. A device to treat byproducts, comprising:
   a transfer passage including a first inlet portion and a discharge portion, the first inlet portion to receive byproducts from a byproduct source; and
   a cleaner to separate the byproducts into a powder and a byproduct gas and including a second inlet portion, the second inlet portion of the cleaner directly coupled to the discharge portion of the transfer passage to directly receive the byproducts from the discharge portion of the transfer passage without passing through a flow line, wherein the discharge portion of the transfer passage and the second inlet portion of the cleaner form a passage, and wherein the passage is substantially linear.

23. The device as claimed in claim 22, wherein the passage is integrally formed with at least one of the transfer passage or the cleaner.

24. The device as claimed in claim 22, wherein the passage is oriented in a vertical direction.

25. The device as claimed in claim 22, further comprising:
   a controller, connected to the cleaner, to select at least one selection line for discharging the byproduct gas, wherein the controller is to select the at least one selection line based on a flux of the byproduct gas.

26. The device as claimed in claim 22, further comprising:
   a trapper integrally coupled to the first inlet portion, of the transfer passage.

* * * * *